(12) United States Patent
Kouno et al.

(10) Patent No.: US 6,803,294 B2
(45) Date of Patent: Oct. 12, 2004

(54) SEMICONDUCTOR WAFER AND MANUFACTURING METHOD OF SEMICONDUCTOR DEVICE

(75) Inventors: Yasuhiko Kouno, Naka (JP); Hideo Miura, Sendai (JP); Nobuyoshi Matsuura, Takasaki (JP); Masaharu Kubo, Hachioji (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/413,562

(22) Filed: Apr. 15, 2003

(65) Prior Publication Data
US 2003/0215985 A1 Nov. 20, 2003

(30) Foreign Application Priority Data
May 15, 2002 (JP) ...................................... 2002-140475

(51) Int. Cl.[7] .............................................. H01L 21/46
(52) U.S. Cl. ...................................... 438/460; 438/464
(58) Field of Search ................................. 438/460–464

(56) References Cited
U.S. PATENT DOCUMENTS
6,583,032 B1 * 6/2003 Ishikawa et al. ............ 438/462

FOREIGN PATENT DOCUMENTS

| JP | 06-244408 | 2/1993 |
|---|---|---|
| JP | 09-330891 | 6/1996 |
| JP | 10-083976 | 9/1996 |
| JP | 11-121466 | 10/1997 |
| JP | 2000-040833 | 7/1998 |

* cited by examiner

Primary Examiner—H. Jey Tsai
(74) Attorney, Agent, or Firm—Reed Smith LLP; Stanley P. Fisher, Esq.; Juan Carlos A. Marquez, Esq.

(57) ABSTRACT

Gate oxide films, gate electrodes, base regions and emitter regions, which constitute IGBTs, are formed on a semiconductor wafer. A silicon oxide film is formed on the gate electrodes. Further, an emitter electrode is formed thereabove, and a passivation film is formed over the emitter electrode. Thereafter, an internal area of a back surface of the semiconductor wafer is polished to form a protrusion at its outer peripheral portion. Afterwards, an impurity is injected from the back surface of the semiconductor wafer to form a collector region. After a collector electrode is further formed, the semiconductor wafer is mounted on a stage smaller than the internal area and subjected to dicing along scribe areas. Thus, the strength of the semiconductor wafer is held by the protrusion, and cracking or the like of the semiconductor wafer can be reduced owing to the execution of the dicing in the above-described manner.

19 Claims, 41 Drawing Sheets

SEMICONDUCTOR WAFER AND MANUFACTURING METHOD OF SEMICONDUCTOR DEVICE

BACKGROUND OF THE INVENTION

The present invention relates to a technology for manufacturing a semiconductor wafer and a semiconductor device, and particularly to a technology effective for application to semiconductor devices formed using a semiconductor wafer having a large bore diameter.

As one means for achieving a reduction in the cost of a semiconductor device (semiconductor integrated circuit device), a semiconductor device manufacturing method using a large bore-diameter semiconductor wafer has been discussed to increase the acquired number of devices (chips) manufactured from one sheet of semiconductor wafer.

On the other hand, as will be further described in detail, there is a need to thin a substrate (semiconductor wafer in its manufacturing process) with a view toward maintaining the performance of a semiconductor device and improving it.

Accordingly, various contrivances have been made to meet the requirements for an increase in the diameter of the semiconductor wafer and its thinning.

A technology for leaving a wafer peripheral portion on both main surfaces of a silicon wafer thickened to increase its diameter and enhance its mechanical strength, for example, and forming first and second concave portions over a wide area, thereby thinning the thickness of a high resistivity layer and improving the speed of response of a semiconductor device has been disclosed in, for example, Unexamined Patent Publication No. Hei 11(1999)-121466.

A technology for avoiding the leaving of a resist in a concave portion defined in a main surface of a wafer at the formation of a low resistivity layer, reducing variations in the characteristic of each device or element and thereby enhancing yields has been disclosed in Unexamined Patent Publication No. Hei 2000-40833. The concave portion is provided to thin the thickness of the wafer and improve the speed of response or the like of a semiconductor device.

Further, a technology for forming cutting trenches wider than lines cut by a dicing saw to thereby achieve a reduction in damage at cutting of semiconductor chips has been disclosed in Unexamined Patent Publication No. Hei 10(1998)-83976.

A technology for defining or making up inverted triangular trenches in scribe lines as dicing line trenches or grooves over a wafer substrate to thereby prevent crack phenomena of chips at cutting of the scribe lines and displacements on dicing has been disclosed in Unexamined Patent Publication No. Hei 9(1997)-330891.

SUMMARY OF THE INVENTION

The present inventors are involved in the investigation and development of a semiconductor device, particularly, a semiconductor integrated circuit device having insulated gate bipolar transistors (IGBTs). The present inventors have studied a method of manufacturing semiconductor devices using a semiconductor wafer of a large bore diameter, e.g., 8 inches (where 1 inch=2.54 cm) or more in order to increase the acquired number of devices (chips) manufactured from one sheet of semiconductor wafer.

In order to (1) enhance a radiation characteristic of the semiconductor device and (2) achieve thinning of a package or achieve layering of a semiconductor chip, there is a need to thin a substrate (semiconductor wafer in its manufacturing process). In a semiconductor element in which a current flows in a vertical direction with respect to the substrate as in the IGBT, the thickness of the substrate greatly affects the performance of the semiconductor element.

Thus, there is a need to use a semiconductor wafer thin and large in bore diameter. However, such a semiconductor wafer has the following problems.

Namely, 1) the semiconductor wafer is apt to break and difficult to handle. 2) The semiconductor wafer per se is low in mechanical strength and apt to produce warpage and distortion. Such warpage and distortion further increase with the stress of a film laminated on the semiconductor wafer, and hence the semiconductor wafer is apt to break during a manufacturing process. This leads to the occurrence of a crystal defect. Further, the semiconductor wafer subsequent to the occurrence of the warpage and distortion is hard to be focalized in a photolithography process, for example. This affects the manufacture of patterns constituting elements. When such an apparatus as to absorb and hold the semiconductor wafer is used, it is not possible to absorb and fix the semiconductor wafer. Thus, a subsequent process cannot be performed. Further, the conveying of the semiconductor wafer also falls into difficulties. 3) Particularly when the semiconductor wafer is cut and brought into fractionization (dicing) every chips at the final stage of a semiconductor device manufacturing process, a mechanical stress is applied to the semiconductor wafer and hence the semiconductor wafer is apt to break. Since the dicing is carried out at the final stage of the semiconductor device manufacturing process, it exerts a large influence on product yields and a TAT (turn around time).

With the promotion of an increase in the bore diameter of the semiconductor wafer, a certain degree of thickness is needed to hold the strength of the semiconductor wafer per se. It is said that the above 8 inch semiconductor wafer needs a thickness of about 1 mm, for example.

Thus, it is difficult to form a large-diameter semiconductor wafer with a thin thickness equal to a substrate, which is required for a final product and manufacture each semiconductor device by using the semiconductor wafer. In its manufacturing process, a step for effecting polishing or the like on the semiconductor wafer from its back surface to thereby reduce its thickness is required.

However, the thin semiconductor wafer involves a problem that it is apt to break, for example, as described above. There is a need to discuss a method for thinning processing, its timing, etc. in various ways in consideration of the semiconductor device manufacturing process.

An object of the present invention is to maintain the strength of a semiconductor wafer even after thinning of the semiconductor wafer.

Another object of the present invention is to maintain the strength of a semiconductor wafer even after thinning of the semiconductor wafer to thereby reduce warpage and cracking of the semiconductor wafer. Further, the present invention aims to make it easy to carry out a process subsequent to the thinning of the semiconductor wafer.

A further object of the present invention is to improve the characteristic of a semiconductor device, and enhance its yields and TAT.

The above, other objects and novel features of the present invention will become apparent from the description of the present specification and the accompanying drawings.

Summaries of representative ones of the inventions disclosed in the present application will be described in brief as follows:

(1) There is provided a semiconductor device manufacturing method of the present invention, wherein an internal area of a back surface of a semiconductor wafer is polished to form a protrusion at an outer peripheral portion of the back surface of the semiconductor wafer, the semiconductor wafer is thereafter mounted on a support table whose surface is smaller than the internal area of the semiconductor wafer, and the internal area of the back surface of the semiconductor wafer is supported by the support table, and scribe areas of the semiconductor wafer are cut.

(2) There is provided a semiconductor device manufacturing method of the present invention, wherein semiconductor elements, wirings, etc. are formed on chip areas of a semiconductor wafer, a protective film corresponding to an insulating film of a top layer for covering these is formed over these, an internal area of a back surface of the semiconductor wafer is polished to form a protrusion at an outer peripheral portion of the back surface of the semiconductor wafer, the semiconductor wafer is thereafter supported on a support table whose surface is smaller than the internal area of the semiconductor wafer, and the internal area of the back surface of the semiconductor wafer is supported by the support table, whereby processing of the semiconductor, e.g., dicing and deposition are carried out. A step for polishing the internal area of the back surface of the semiconductor wafer is not necessarily limited to after the formation of the passivation film. Such a step may be performed between the step of forming the semiconductor elements and wirings and the step of forming the protective film. After the polishing of the internal area of the back surface of the semiconductor wafer, ion implantation and deposition or growth may be effected on the back surface of the semiconductor wafer.

(3) There is provided a semiconductor wafer having (a) a plurality of chip areas respectively comparted by scribe areas, and an internal area of a back surface thereof, which is recessed as viewed from an outer peripheral portion thereof, wherein a diameter (d4) of the internal area is larger than a diameter (d2) of a minimum circle surrounding the plurality of chip areas, (b) semiconductor elements are formed in the chip areas, and (c) trenches are formed on the scribe areas of the surface of the semiconductor wafer.

In the semiconductor wafer, each of the semiconductor elements formed in the plurality of chip areas of the (b) includes:

(b1) a first insulating film formed over the chip areas;

(b2) a gate electrode formed over the first insulating film;

(b3) a first semiconductor region of first conductivity type formed in the chip area on both sides of the gate electrode;

(b4) a second semiconductor region of second conductivity type opposite to the first conductivity type, which is formed in the first semiconductor region;

(b5) a second insulating film formed over the gate electrode and having openings over the second semiconductor region;

(b6) a first conductive film formed over the second insulating film including the top of the second semiconductor region;

(b7) a protective film formed over the first conductive film and corresponding to an insulating film of a top layer for covering the first conductive film;

(b8) a third semiconductor region of the first conductivity type formed on the back surface of the semiconductor wafer; and (b9) a second conductive film formed on the back surface of the semiconductor wafer.

In the semiconductor wafer, an area corresponding to the surface of the semiconductor wafer and including the plurality of chip areas is formed lower than an outer peripheral portion of the surface of the semiconductor wafer, and the height of the outer peripheral portion is higher than the protective film corresponding to the insulating film of the top layer for covering an upper portion of each of the semiconductor elements.

There is provided a semiconductor wafer comprising:

(a) a plurality of chip areas respectively comparted by scribe areas;

(b) a ring-shaped member whose inside diameter (d5) is larger than a diameter (d2) of a minimum circle surrounding the plurality of chip areas, said ring-shaped member being bonded to an outer peripheral portion of a back surface of the semiconductor wafer;

(c) semiconductor elements formed on the chip areas; and (d) trenches formed over the scribe areas of the surface of the semiconductor wafer.

Figure 1:
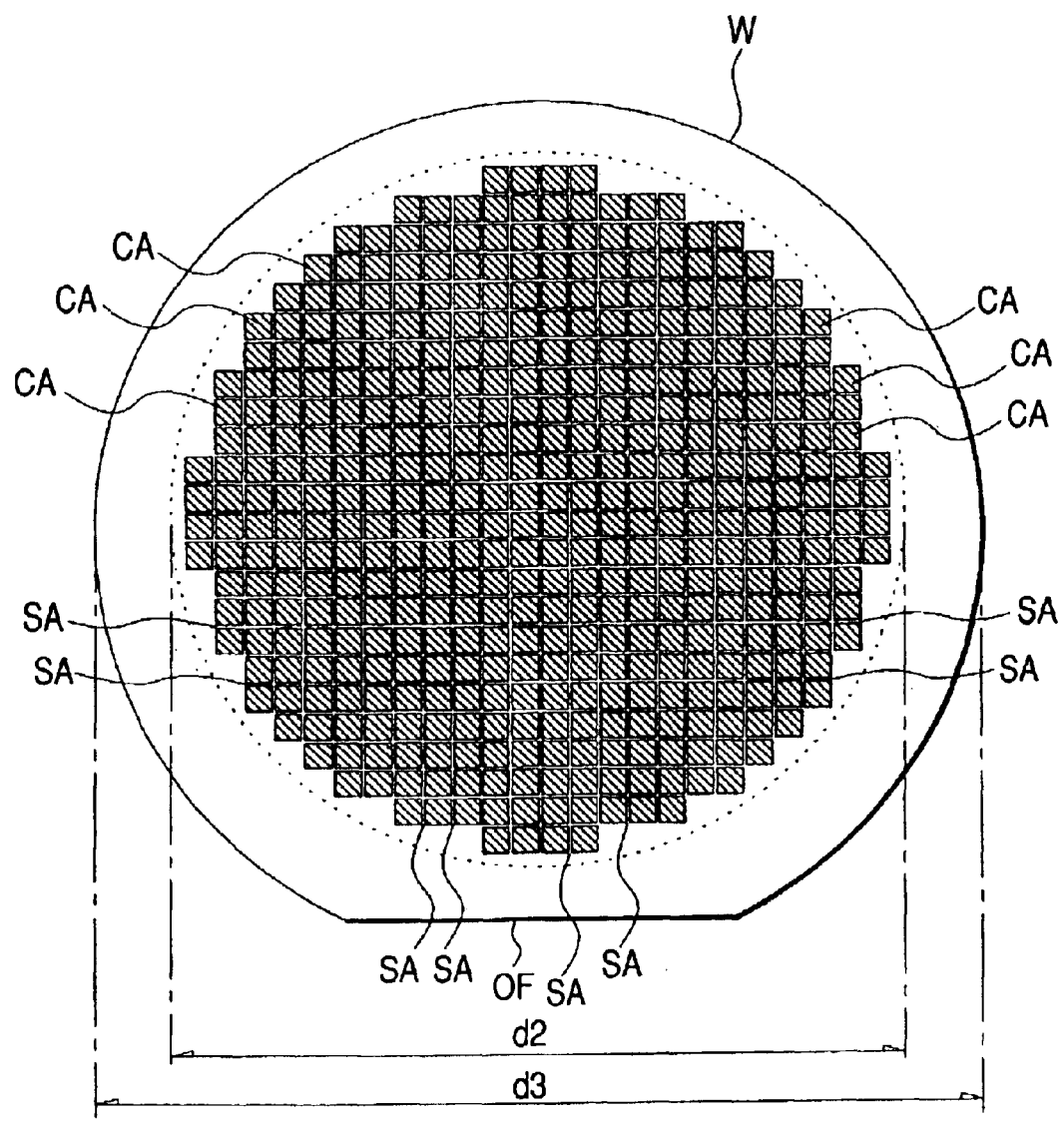
FIG. 1 is a fragmentary plan view of a wafer (substrate), which shows a method of manufacturing a semiconductor device, according to a first embodiment of the present invention.

DETAILED DESCRIPTION OF THE PREFERRED EMBODIMENTS (First Embodiment)

A first embodiment of the present invention will hereinafter be described in detail based on the accompanying drawings. Incidentally, components each having the same function in all drawings for describing embodiments are respectively identified by the same reference numerals and their repetitive description will be omitted.

FIGS. 1 through 25 are respectively fragmentary cross-sectional views or fragmentary plan views of a semiconductor wafer (substrate), which show a method of manufacturing each of semiconductor devices, according to the first embodiment of the present invention.

FIG. 1 is a fragmentary plan view of the semiconductor wafer W on which the semiconductor device according to the present embodiment is formed.

As shown in FIG. 1, the semiconductor wafer W is substantially circular and has a plurality of substantially rectangular chip areas CA. A cut portion f the semiconductor wafer W is orientation flat (OF). Scribe areas SA are respectively formed among the chip areas CA. The chip areas CA are separated from one another by cutting the semiconductor wafer W along these scribe areas SA. Incidentally, there is no need to clearly define the chip areas CA (10 mm×10 mm) and the scribe areas SA in appearance before the manufacture of the semiconductor device. A bore diameter (d3) of the semiconductor wafer W is 300 mm, for example, and the thickness thereof is about 1000 $\mu$m. The diameter of the minimum circle, which surrounds the plurality of chip areas CA, is given by d2.

Various semiconductor elements, wirings, etc. are formed in each of the chip areas CA. A description will, however, be made here of a case in which IGBTs are formed as semiconductor devices or elements. Each of the IGBTs has a rated voltage of 600V and a rated current of 200A. The rated voltage means a withstand voltage and is an upper limit voltage at which the IGBT is capable of maintaining an off state. The rated current shows the maximum current caused to stationarily flow by the IGBT.

Figure 2:
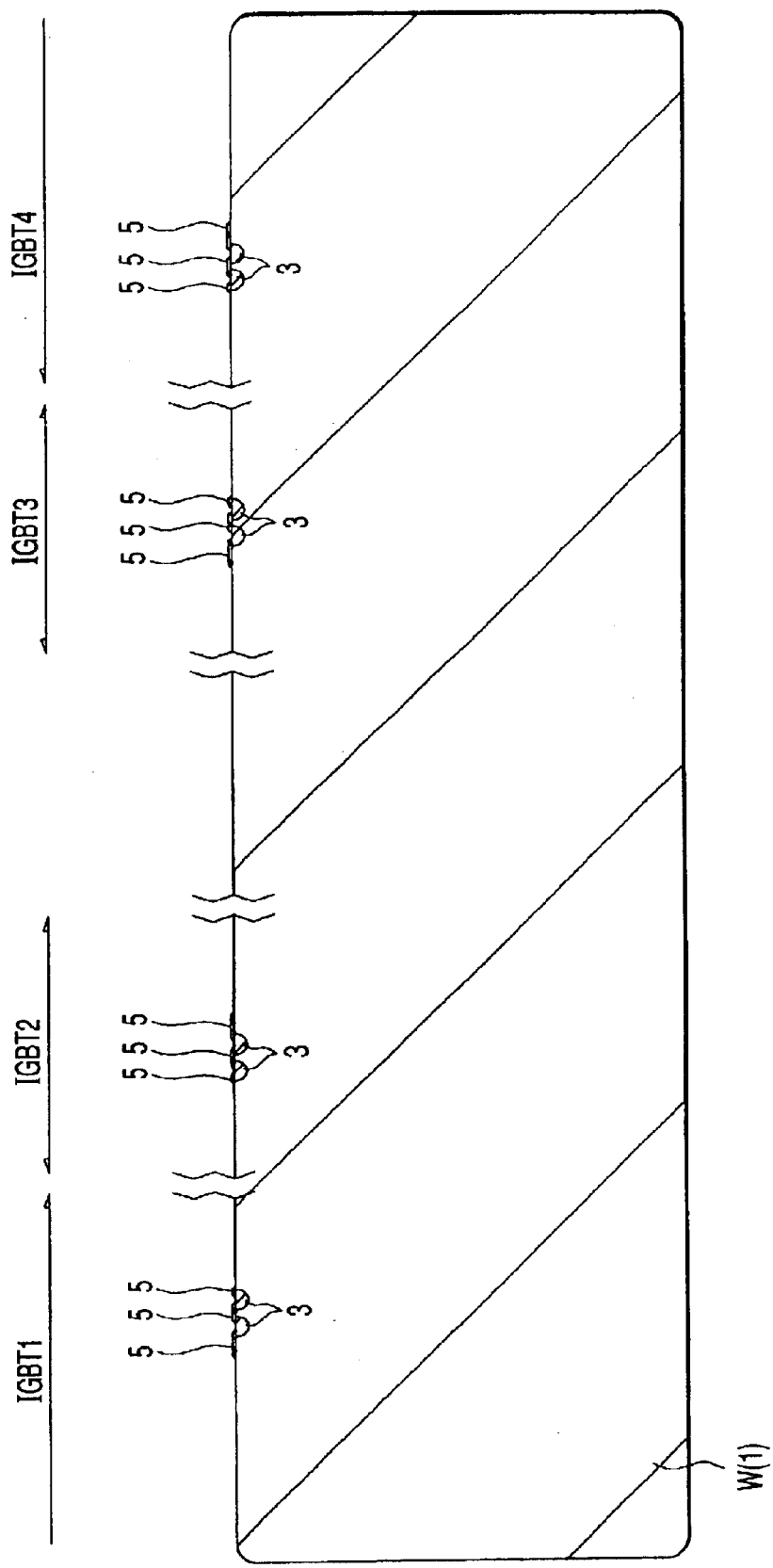
FIG. 2 is a fragmentary cross-sectional view of the wafer (substrate), which illustrates the method of manufacturing the semiconductor device, according to the first embodiment of the present invention.
Figure 3:
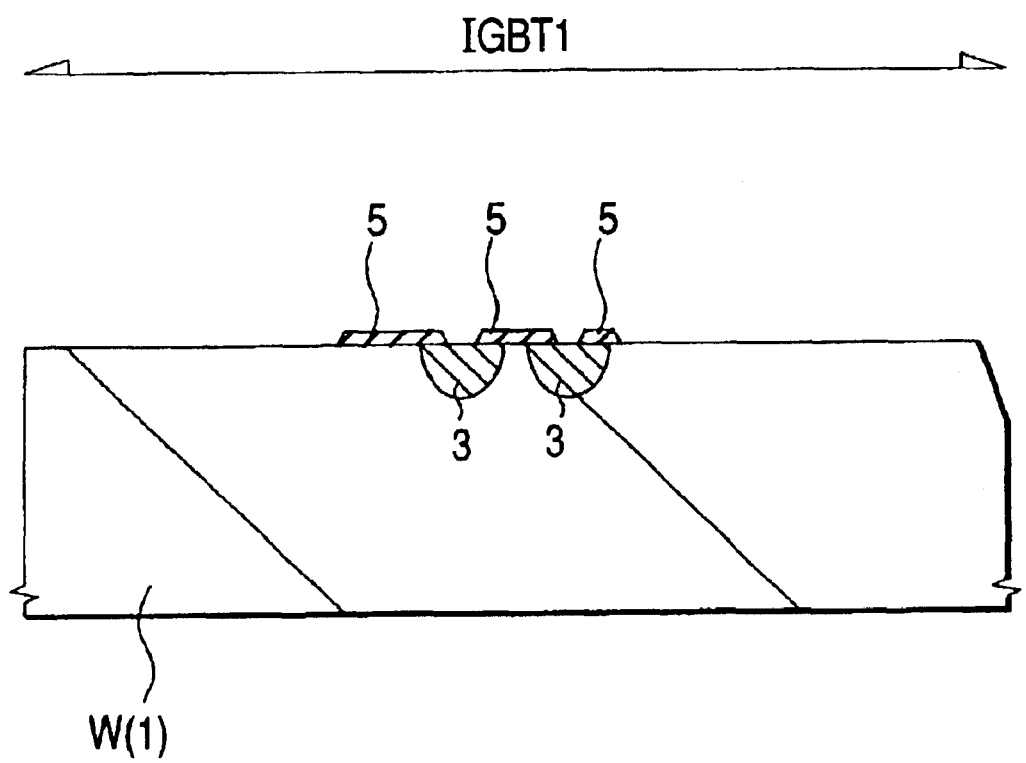
FIG. 3 is a fragmentary cross-sectional view of the wafer (substrate), which depicts the method of manufacturing the semiconductor device, according to the first embodiment of the present invention.

As shown in FIGS. 2 and 3, a semiconductor wafer W (semiconductor substrate 1) made up of n-type monocrystal silicon is prepared. A p-type impurity (boron) is injected and diffused (thermal-diffused) with a photoresist film (hereinafter called simply "resist film", which is not shown in the drawings) on the semiconductor wafer W as a mask to thereby form p-type wells 3.

Incidentally, FIG. 3 is a partly enlarged view of one of areas (IGBT1 through IGBT4) in which the IGBTs of FIG. 2 are formed (FIG. 4 and FIG. 5, FIG. 6 and FIG. 7, FIG. 8 and FIG. 9, FIG. 12 and FIG. 13, and FIG. 14 and FIG. 15 are respectively the same as FIG. 2 and FIG. 3). Partly enlarged views of these drawings are respectively marked with reference numerals for respective portions constituting the IGBTs. In the whole drawing of the semiconductor wafer, only principal portions are respectively identified by reference numerals to make it easy to see the drawings.

Next, a silicon oxide film is formed on the semiconductor wafer W as an insulating film by a thermal oxidation method. The silicon oxide film is selectively removed to form field oxide films 5.

Figure 4:
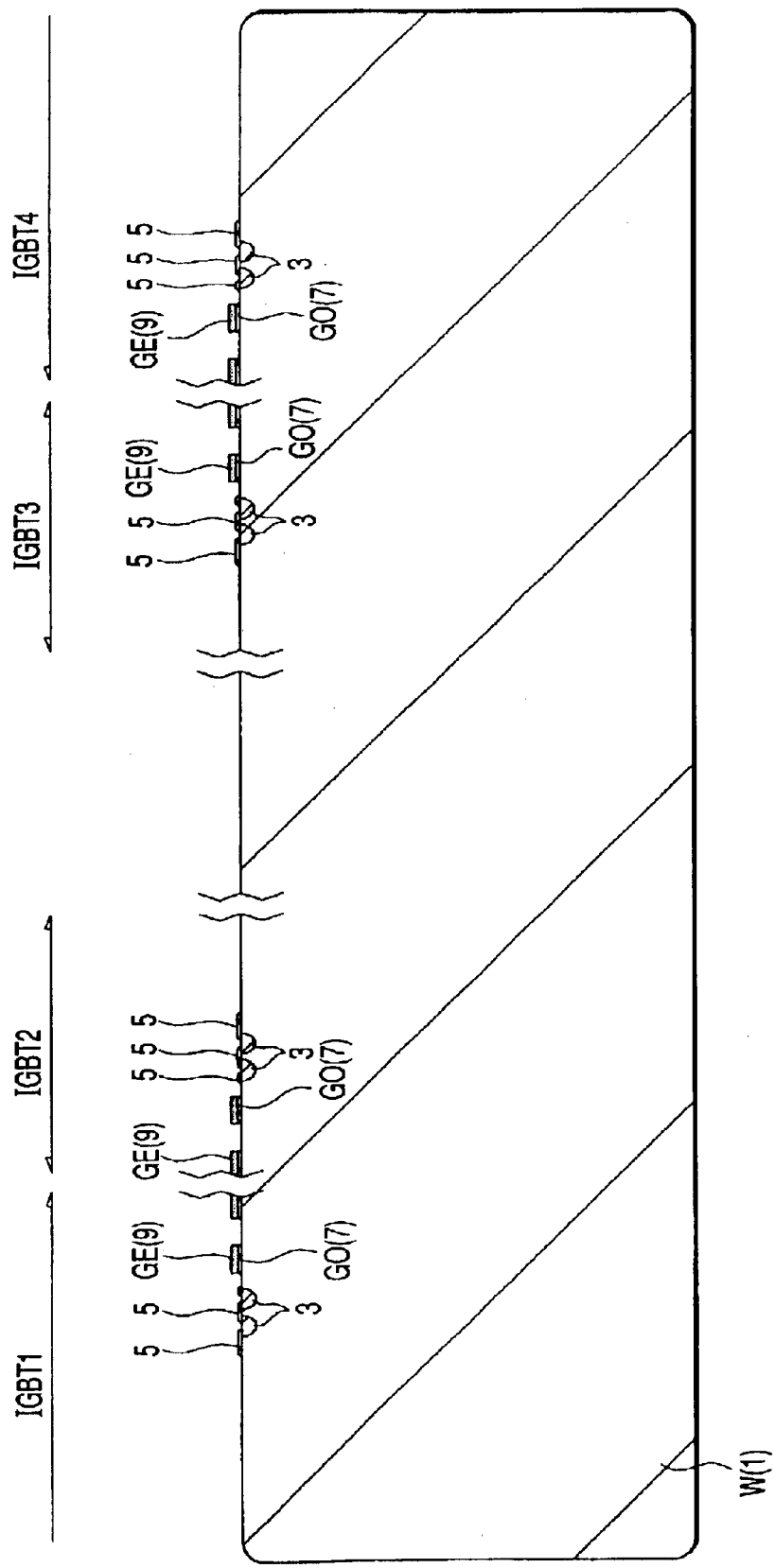
FIG. 4 is a fragmentary cross-sectional view of the wafer (substrate), which shows the method of manufacturing the semiconductor device, according to the first embodiment of the present invention.
Figure 5:
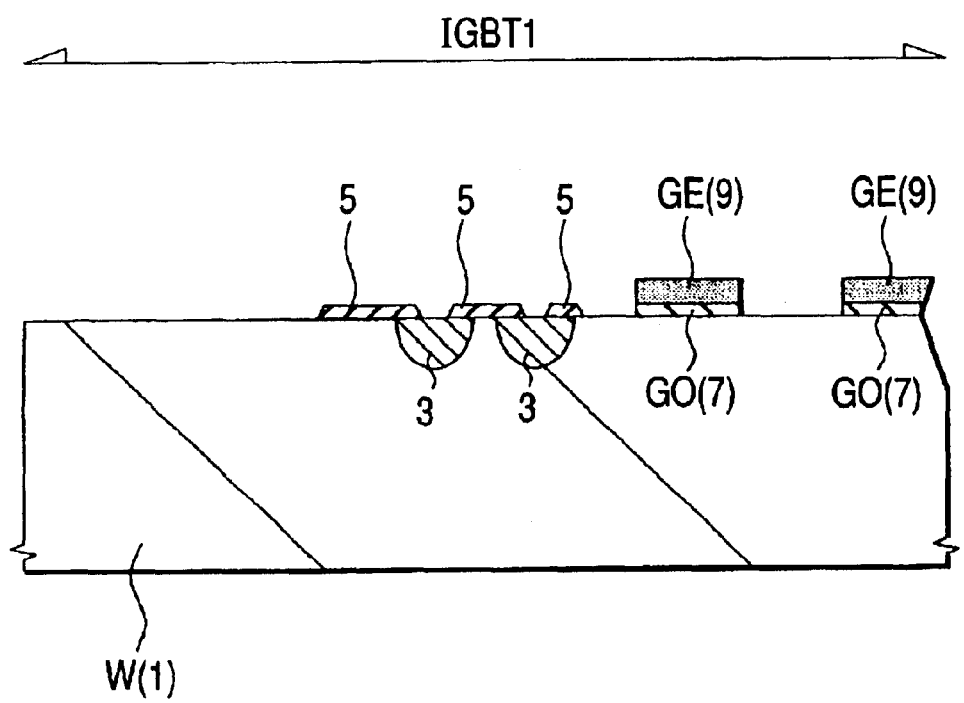
FIG. 5 is a fragmentary cross-sectional view of the wafer (substrate), which illustrates the method of manufacturing the semiconductor device, according to the first embodiment of the present invention.

Next, as shown in FIGS. 4 and 5, for example, the surface of the semiconductor wafer W is thermally-oxidized to form a thermal oxide film 7. Further, a polycrystal silicon film 9 is deposited thereover as a conductive film by a CVD method. Next, the thermal oxidation film 7 and the polycrystal silicon film 9 are etched with a resist film (not shown) placed over the polycrystal silicon film 9 as a mask to thereby form gate electrodes GR and gate oxide films (gate insulating films) GO formed therebelow.

Figure 6:
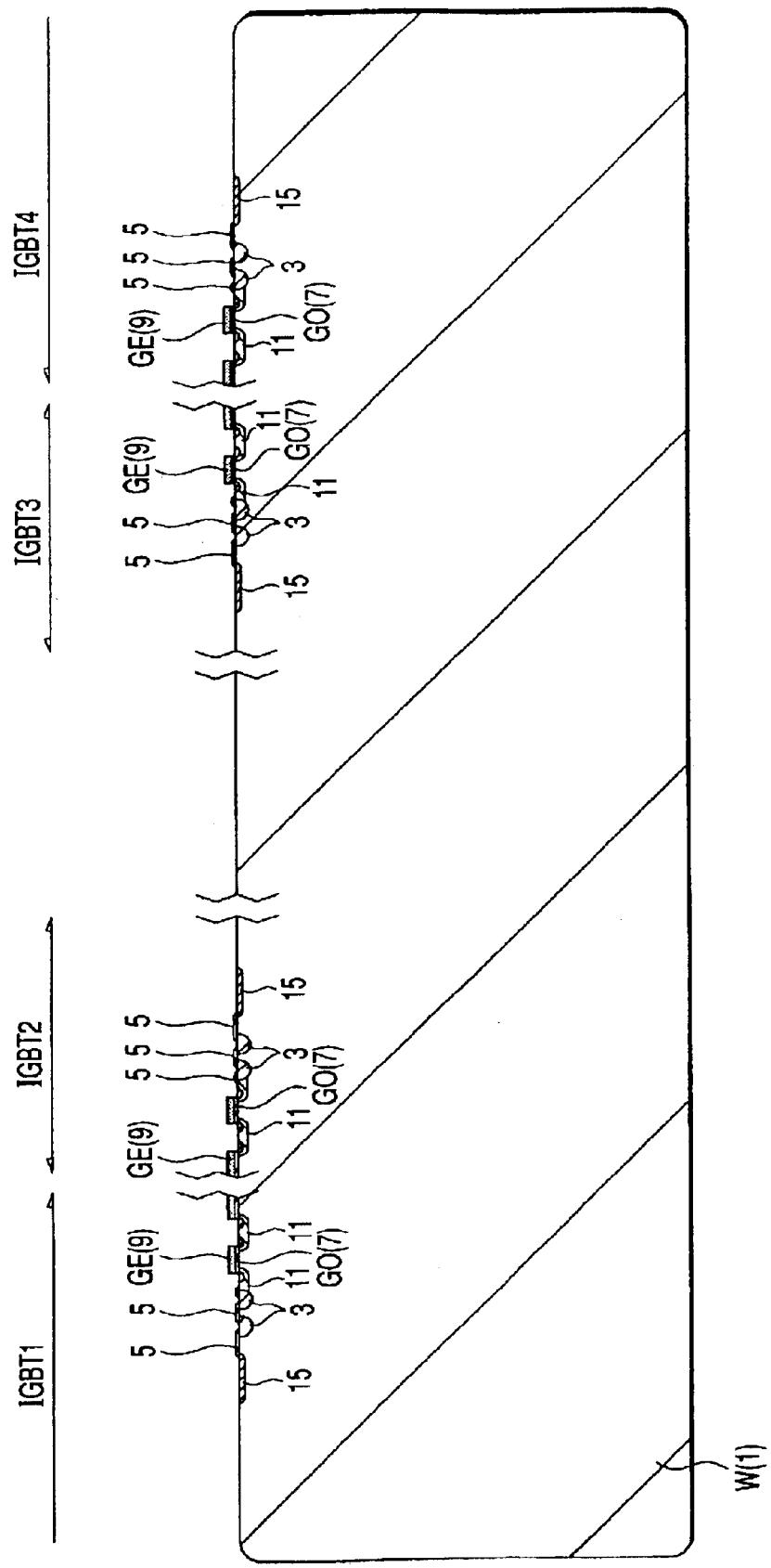
FIG. 6 is a fragmentary cross-sectional view of the wafer (substrate), which shows the method of manufacturing the semiconductor device, according to the first embodiment of the present invention.
Figure 7:
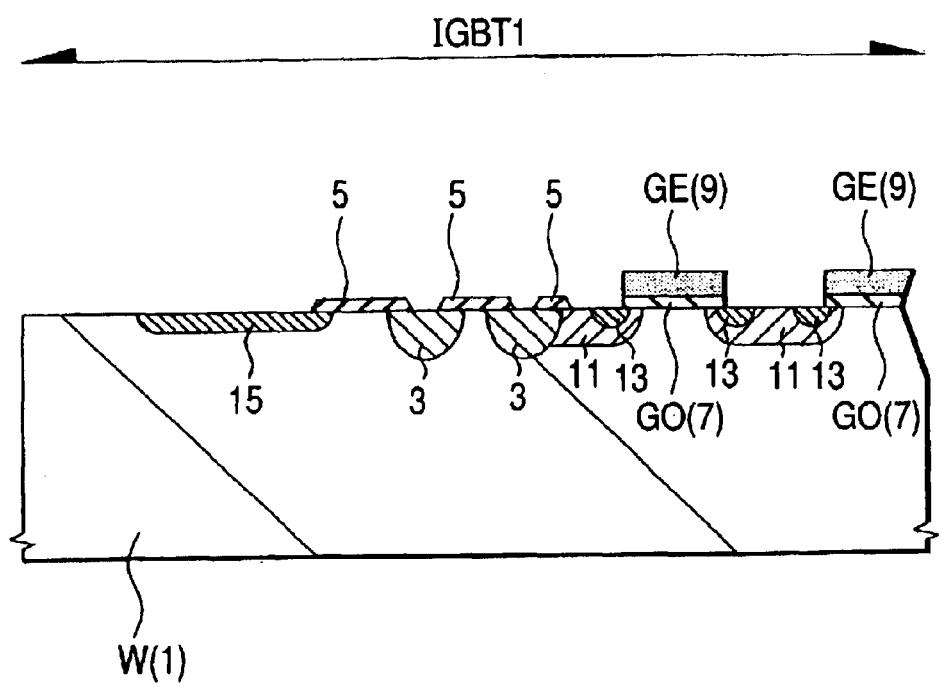
FIG. 7 is a fragmentary cross-sectional view of the wafer (substrate), which depicts the method of manufacturing the semiconductor device, according to the first embodiment of the present invention.

Next, as shown in FIGS. 6 and 7, a p-type impurity is injected into both sides of each gate electrode GE and thereafter diffused to thereby form base regions (p-type semiconductor regions) 11. Next, a resist film (not shown) having openings on an emitter forming area is formed on the semiconductor wafer W. With the resist film as a mask, an n-type impurity is injected and diffused to form emitter regions (n-type semiconductor regions) 13. Each of the emitter regions 13 is formed shallower than each base region. Incidentally, a channel stopper region (n-type semiconductor region) 15 is also formed at this time.

Figure 8:
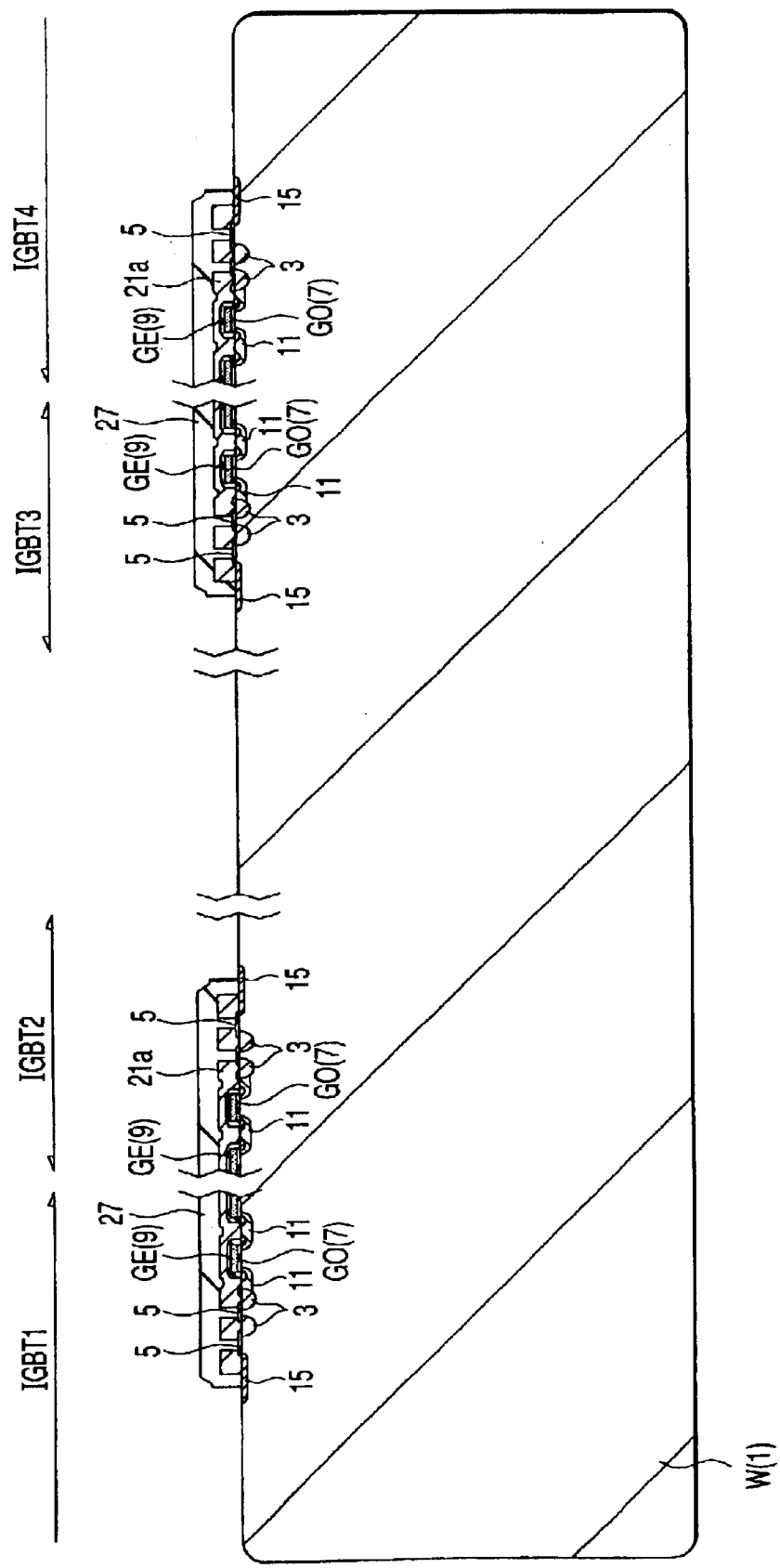
FIG. 8 is a fragmentary cross-sectional view of the wafer (substrate), which illustrates the method of manufacturing the semiconductor device, according to the first embodiment of the present invention.
Figure 9:
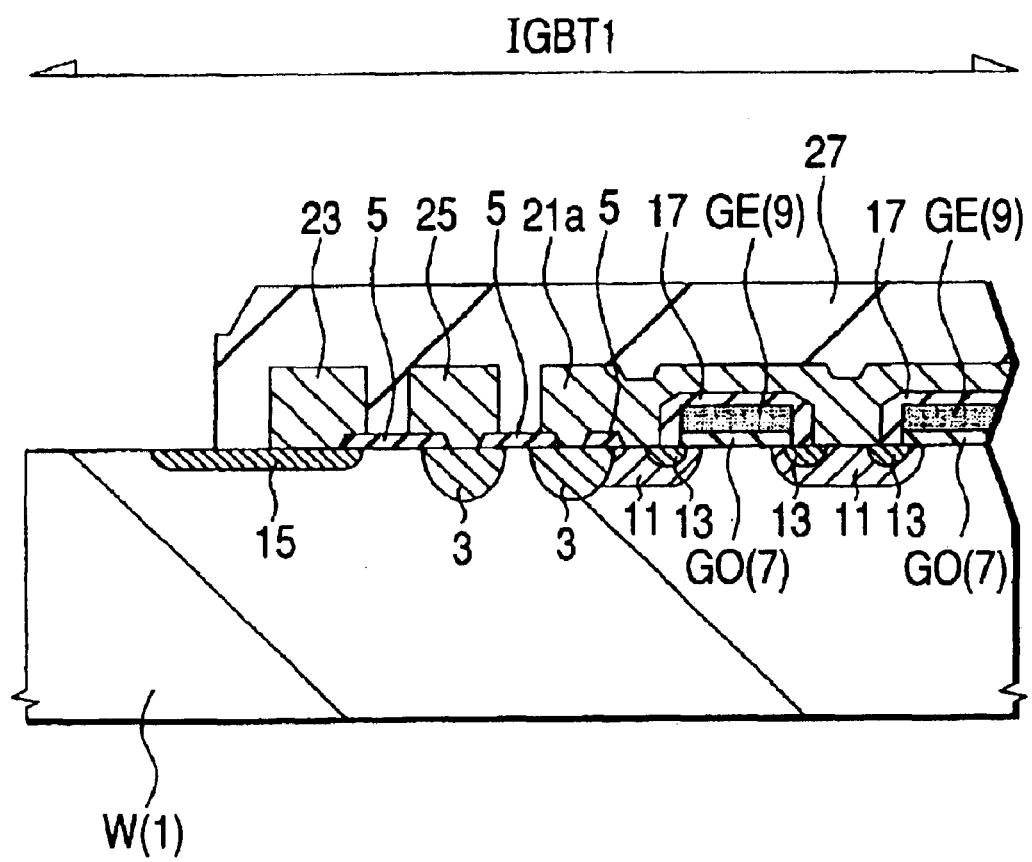
FIG. 9 is a fragmentary cross-sectional view of the wafer (substrate), which shows the method of manufacturing the semiconductor device, according to the first embodiment of the present invention.

Next, as shown in FIGS. 8 and 9, a silicon oxide film (PSG: Phosphor Silicate Glass) film 17 is formed on the semiconductor wafer W as an insulating film. With an unillustrated resist film as a mask, the silicon oxide film 17 is next etched to form connecting holes on the emitter regions 13.

Next, an aluminum film 21 is deposited on the silicon oxide films 17 including the connecting holes as a conductive film by a sputtering method, for example. With a resist film (not shown) on the aluminum film 21 as a mask, the aluminum film is etched to desired shapes to thereby form emitter drawing electrodes (wirings) 21a. At this time, a guard ring 23 is also formed so as to surround an outer peripheral portion of each IGBT forming area. The guard ring 23 plays a role in preventing a reduction in withstand voltage due to attainment of a depletion layer to a chip end. Field plates 25 are formed on the p-type wells 3. The field plates 25 play a role in controlling the expansion of the depletion layer and preventing a reduction in withstand voltage due to local concentration of an electric field.

Next, a polyimide layer is formed over the emitter electrodes (wirings) 21a or the like as an insulating film. The polyimide film lying in desired regions such as pad regions (not shown) or the like on the scribe areas and emitter electrodes 21a is next removed by etching to thereby form each passivation film 27 (protective film). The passivation film 27 is of the top layer film of the films deposited on the semiconductor wafer surface in the wafer state and plays a role in protecting semiconductor elements such as IGBTs and wirings.

Figure 10:
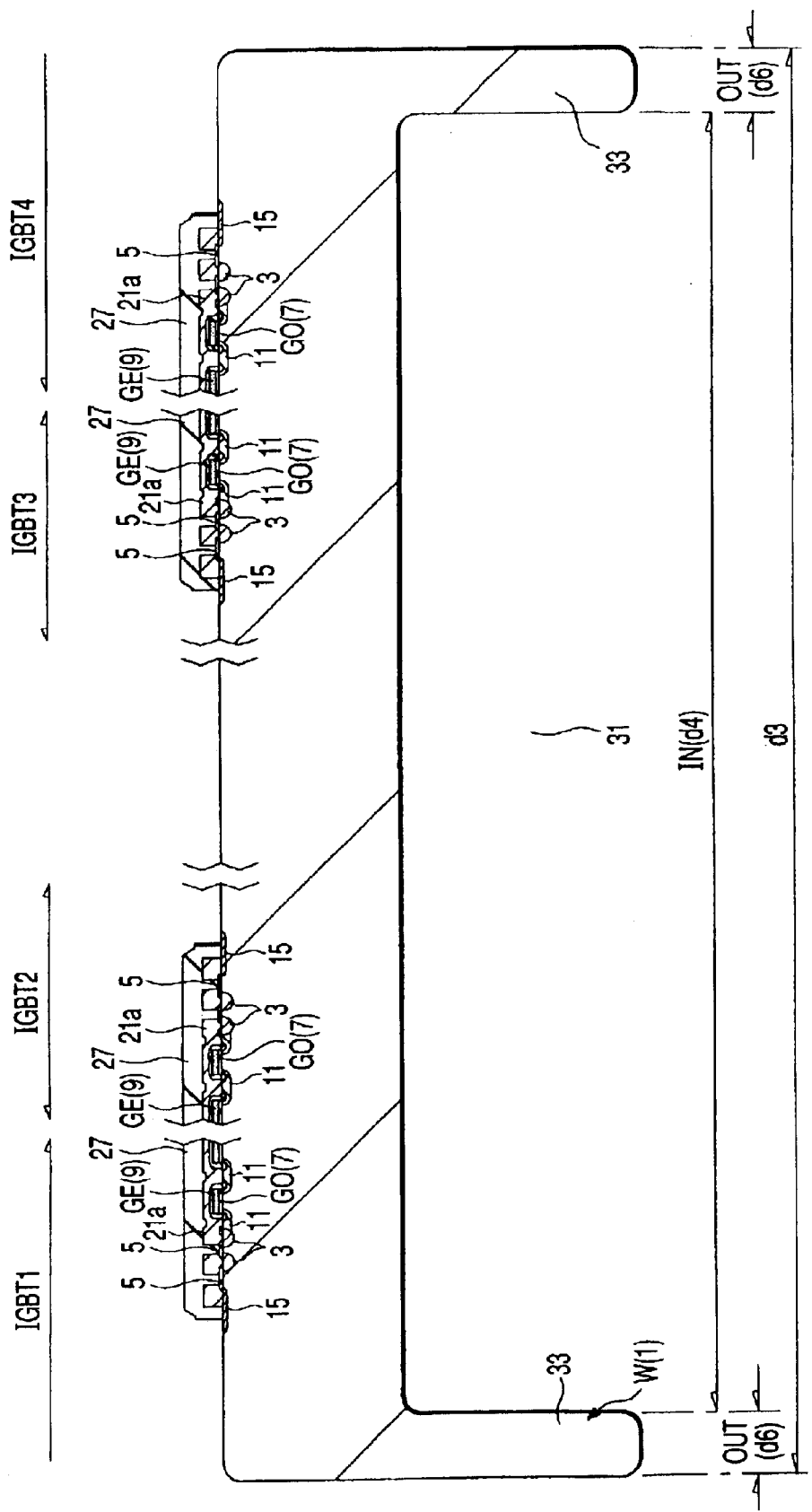
FIG. 10 is a fragmentary cross-sectional view of the wafer (substrate), which illustrates the method of manufacturing the semiconductor device, according to the first embodiment of the present invention.
Figure 11:
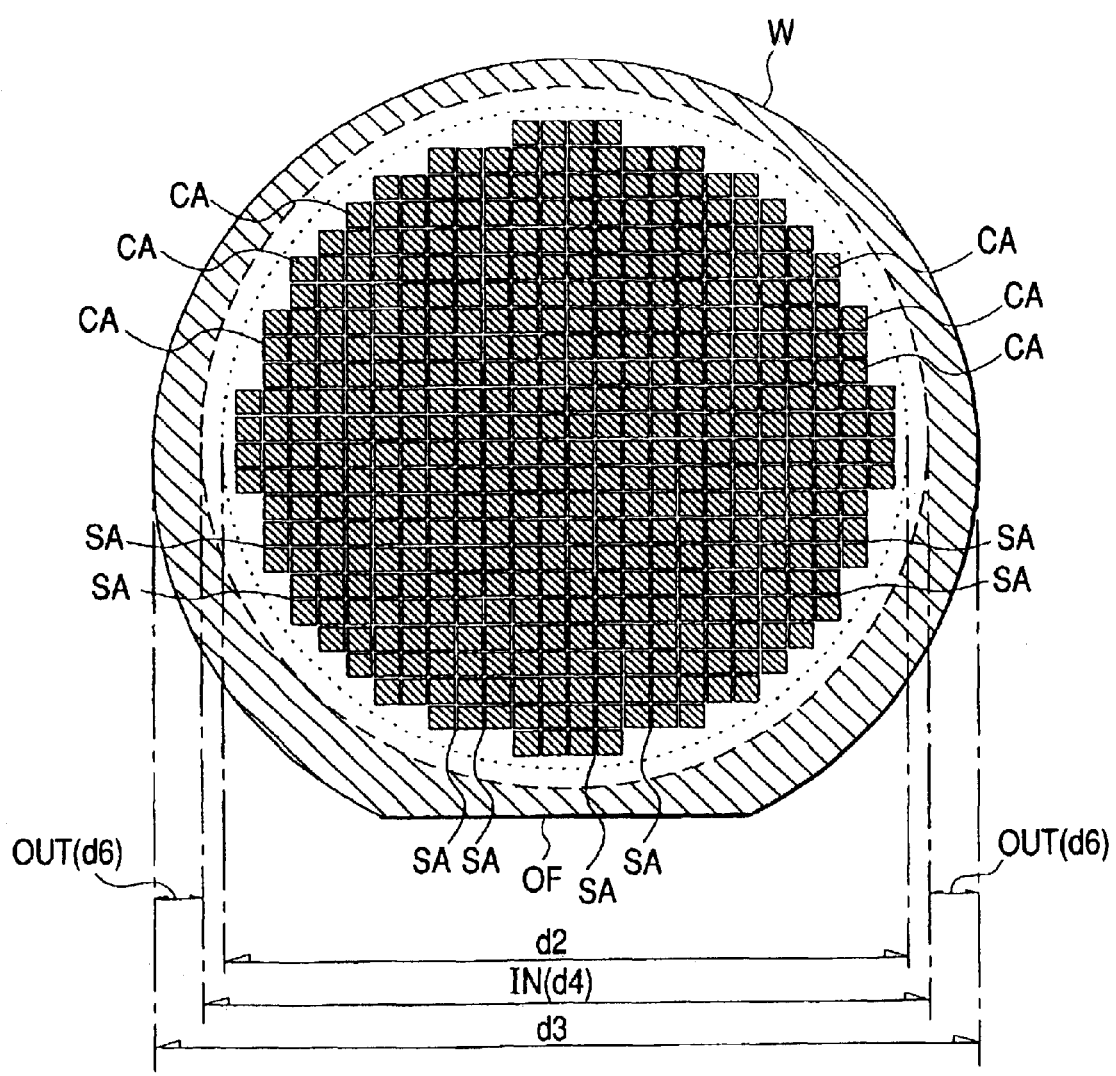
FIG. 11 is a fragmentary plan view of the wafer (substrate), which shows the method of manufacturing the semiconductor device, according to the first embodiment of the present invention.

Next, as shown in FIGS. 10 and 11, the back surface of the semiconductor wafer W is polished to recess or depress an internal area IN of the back surface of the semiconductor wafer W, thereby forming a recess (convex portion) 31. In other words, a protrusion (concave portion) 33 is formed at an outer peripheral portion OUT of the back surface of the semiconductor wafer W. The outer peripheral portion OUT of the semiconductor wafer W is part of an area in which the formation of a chip is prohibited, and corresponds to an area lying outside the internal area IN.

As a method of thinning the semiconductor wafer W, may be mentioned, for example, chemical etching, a so-called sand blaster method of spraying sand-like particles and polishing the back surface thereof, etc. in addition to grinder-based polishing, etc. FIG. 10 is a fragmentary cross-sectional view of the post-polishing semiconductor wafer, and FIG. 11 is a fragmentary plan view thereof.

Since the diameter of the internal area IN is d4 and the diameter of the semiconductor wafer W is d3, the widths d6 of both ends of the outer peripheral portion OUT are represented as about (d3−d4)/2. Incidentally, the width of the peripheral portion OUT may preferably ensure a predetermined width, e.g., d6/2 or more even at the orientation flat OF.

The thickness of the internal area IN of the semiconductor wafer W is about 95 μm. Incidentally, the width d6 of the outer peripheral portion OUT of the semiconductor wafer W may preferably be 500 μm or more. In a semiconductor wafer having a bore diameter 300 mm or more in particular, the width d6 of the outer peripheral portion OUT may preferably be 500 μm or more.

According to the present embodiment as described above, since the semiconductor wafer is polished from the back surface and thereby thinned, the semiconductor device is improved in characteristic as will be described later. Since the outer peripheral OUT of the semiconductor wafer W is not thinned upon thinning of the semiconductor wafer, the mechanical strength of the semiconductor wafer W can be maintained by the protrusion 33, and hence the handling of subsequent process steps can be made easy. The cracking of the semiconductor wafer W can be prevented from occurring. It is possible to reduce slippage and distortion of the semiconductor wafer. Further, a crystal defect can be less reduced.

Figure 12:
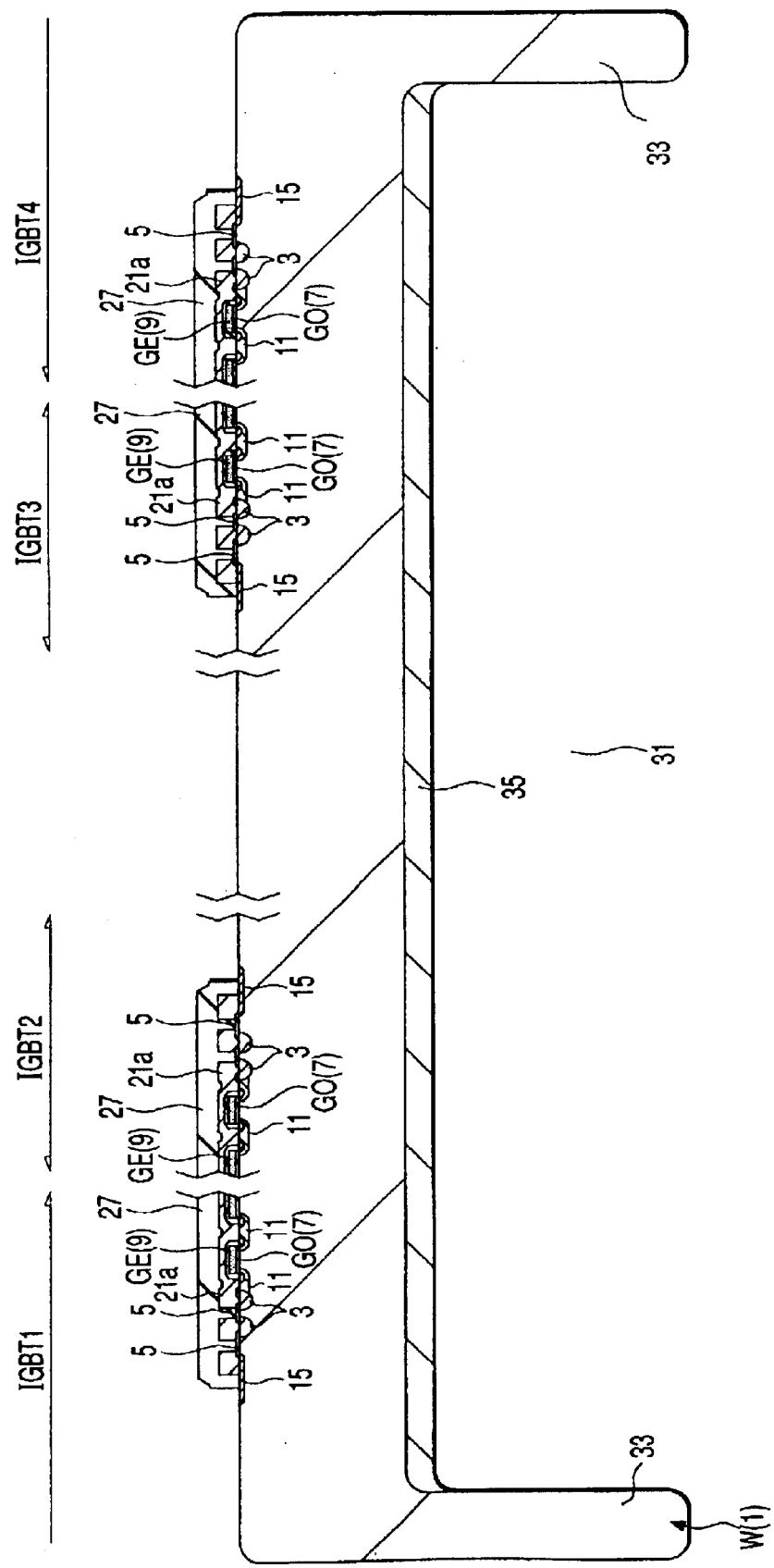
FIG. 12 is a fragmentary cross-sectional view of the wafer (substrate), which depicts the method of manufacturing the semiconductor device, according to the first embodiment of the present invention.
Figure 13:
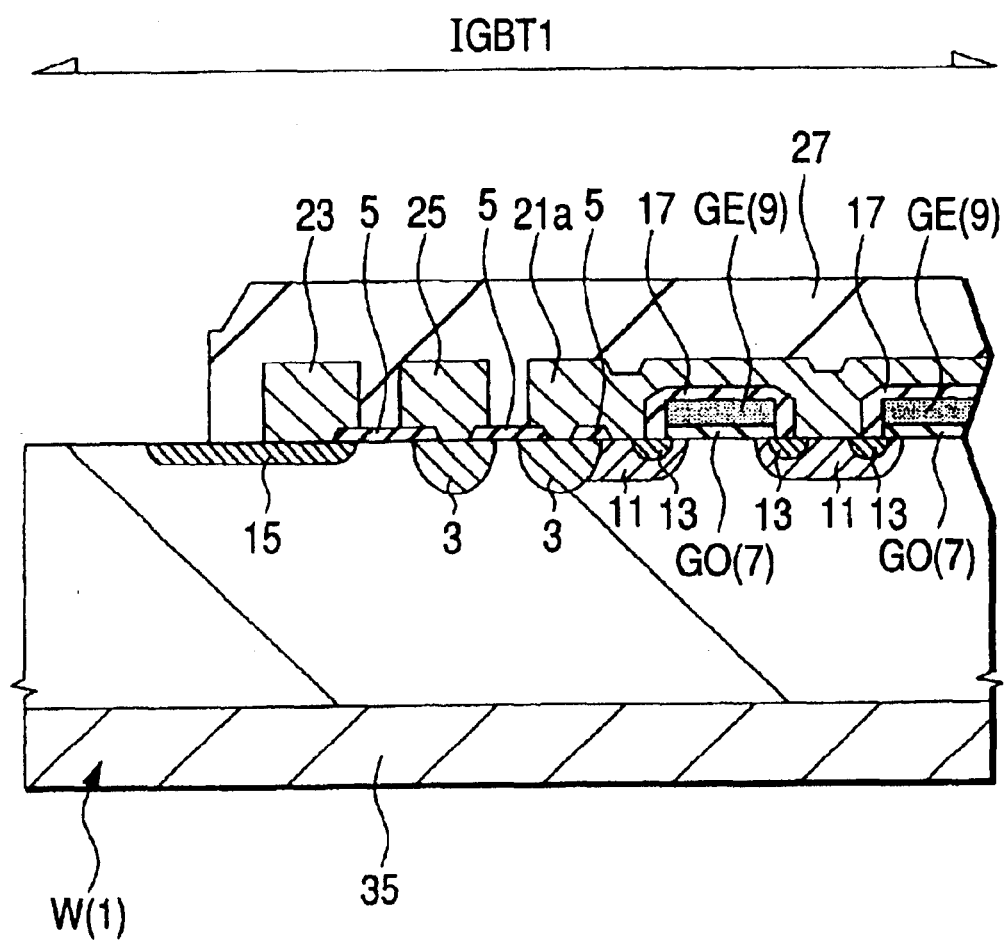
FIG. 13 is a fragmentary cross-sectional view of the wafer (substrate), which shows the method of manufacturing the semiconductor device, according to the first embodiment of the present invention.

Next, as shown in FIGS. 12 and 13, a p-type impurity (boron or the like) is injected into the back surface of the semiconductor wafer W and subjected to thermal diffusion at 1200° C., for example, to thereby form a collector region (p-type semiconductor region) 35. Since, at this time, the surface of the semiconductor wafer W is covered with the passivation film 27, devices or elements, wirings, etc. can be prevented from breaking down even if the injection of an impurity or the like is performed with the surface of the semiconductor wafer W as the lower side. Further, the elements, wirings, etc. can be prevented from being contaminated by a foreign matter or the like even in that case.

Incidentally, the collector region 35 may be formed by injecting a p-type impurity through a collector electrode 37 to be described later after the collector electrode 37 has been formed. In this case, however, a thermal treatment temperature at the diffusion of the p-type impurity is restricted so as to be lower than the melting point of a metal film constituting the collector electrode. Thus, when a metal relatively low in melting point is used for the collector electrode, the collector electrode may preferably be formed after the formation of the collector region. As a result, the corresponding collector region 35 having a desired density profile can be formed.

Thus, an IGBT in which the collector region (p-type semiconductor region) 35 is formed on the back surface of the semiconductor wafer W, is called "non punch-through type". On the other hand, an IGBT having an n+-type semiconductor region higher than the substrate in concentration is called "punch-through type". In this case, a process step for injecting and diffusing an n-type impurity into the back surface of the semiconductor wafer W is further needed.

Figure 14:
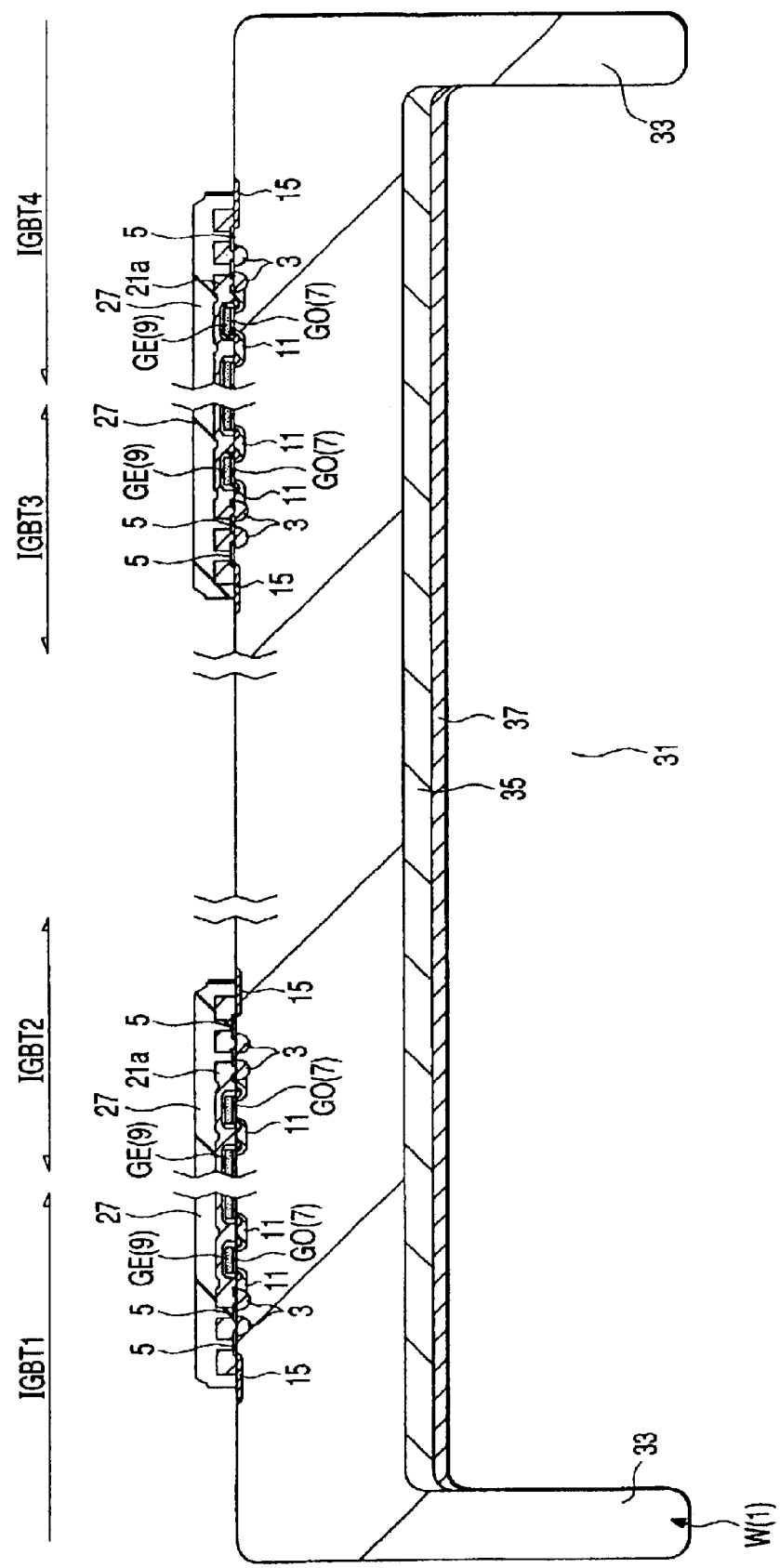
FIG. 14 is a fragmentary cross-sectional view of the wafer (substrate), which illustrates the method of manufacturing the semiconductor device, according to the first embodiment of the present invention.
Figure 15:
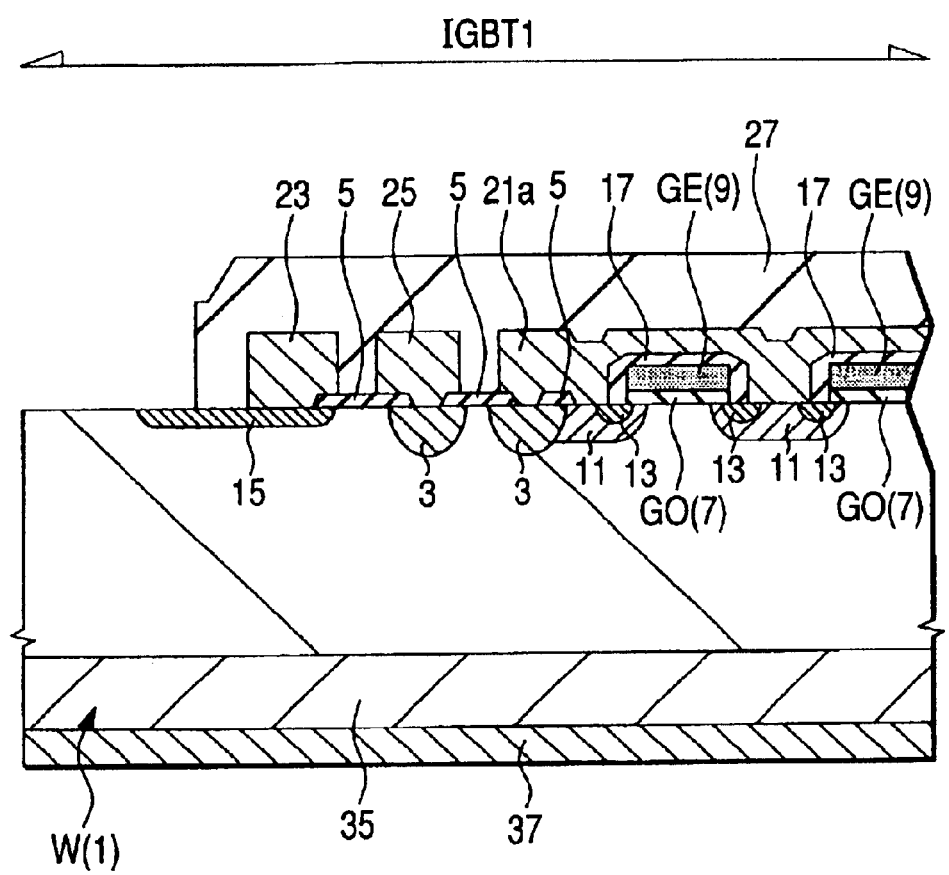
FIG. 15 is a fragmentary cross-sectional view of the wafer (substrate), which shows the method of manufacturing the semiconductor device, according to the first embodiment of the present invention.

Next, as shown in FIGS. 14 and 15, an aluminum film is deposited on the collector region 35 on the back surface of the semiconductor wafer W as a conductive film to form the collector electrode 37. Since the surface of the semiconductor wafer W is covered with the passivation film 27 even in this case, the elements, wirings, etc. can be prevented from destruction even if the aluminum film is deposited with the surface of the semiconductor wafer W as the lower side. Further, the elements, wirings, etc. can be prevented from being contaminated due to the foreign material or the like.

Incidentally, heavy ions such as an electron beam, helium (He) or the like are thereafter applied and recovery anneal is further carried out, so that a lifetime can be controlled. When a switching speed is made fast in particular, such processing may preferably be performed.

According to the above steps, the base regions 11 are respectively formed between the gate electrodes GE, and the emitter regions 13 are formed thereinside. Thus, the IGBTs are completed wherein the collector region 35 is formed on the back surface of the substrate. Incidentally, the emitter regions 13 are connected to their corresponding external terminals through the emitter electrodes 21a, and the collector region 35 is connected to its corresponding external terminal through the collector electrode 37. Each base region 11 is controlled by a potential applied to the gate electrode GE.

Since the collector region 35 is formed after the semiconductor wafer W has been polished from its back surface, and the collector electrode 37 is formed on the surface of the collector region 35 in the present embodiment as described above, the characteristic of each individual IGBT can be enhanced.

Namely, when the IGBT having the rated voltage of 600V is used, the thickness of the substrate 1 at the completion of the IGBT may preferably range from about 50 μm to about 60 μm. When, however, the semiconductor wafer remains with the original thickness (100 μm), the impurity constituting the collector region 35 must be diffused toward the interior of the substrate 1 by a distance of about 950 μm by thermal diffusion after the injection thereof from the back surface of the semiconductor wafer W in order to set the thickness of the substrate 1 at the completion of the IGBT to the range of about 50 μm to about 60 μm, thus making its formation difficult realistically.

If a thin semiconductor wafer is used, then the formation of a collector layer by ion implantation from its back surface is enabled but a semiconductor wafer large in bore diameter cannot be used.

On the other hand, there is also considered a case in which a p-type semiconductor wafer is used and an n-type semiconductor layer is epitaxially grown over it to form each IGBT. Since, however, the cost increases and the preparation of the thin p-type semiconductor wafer becomes difficult in such a case, it becomes difficult to control the collector region 35 to a desired thickness.

In the present embodiment on the contrary, the collector region 35 is formed after the back surface of the semiconductor wafer W has been polished, and the collector electrode 37 is formed on the surface of the collector region 35. It is therefore possible to reduce the resistance of the substrate (between the base regions 11 and the collector region 35) and easily effect control or the like on the impurity concentration of the collector region 35. Accordingly, the characteristic of each IGBT can be enhanced.

In the device in which the element in which a current flows in a vertical direction and the drawing electrode formed on the back surface of the semiconductor wafer W (substrate) are provided for the semiconductor wafer W (substrate), as in the IGBT in particular, the thickness of the substrate is greatly connected with the characteristic of its element. Thus, the contrivance of preventing warpage or cracking of the semiconductor wafer W in an element manufacturing process while maintaining the characteristic of the element becomes important.

Since the thickness of the semiconductor wafer W is ensured before the polishing of its back surface, the semiconductor wafer W can be prevented from cracking and distortion, and the characteristic of each semiconductor element formed on its main surface can be enhanced. Particularly when the film is laminated on the semiconductor wafer W, a film stress is applied thereto and hence the semiconductor wafer W becomes easy to warp. Such a film stress is large in metal film. For instance, a large stress is applied to the semiconductor wafer W after the deposition of the aluminum film at the formation of the emitter electrode. In the present embodiment, however, the semiconductor wafer W is held in a thick state until the passivation film 27 corresponding to the top layer film of the films deposited over the surface of the semiconductor wafer W in the wafer state is formed. Therefore, even if the stress is further applied to the deposited films, the semiconductor wafer W is hard to warp and the respective films constituting the element and the like can be formed with satisfactory accuracy. The semiconductor wafer W can be prevented from cracking. It is possible to reduce the occurrence of a crystal defect.

A semiconductor wafer W having a large bore diameter can be used, and yields can be enhanced. It is also possible to shorten a TAT.

Since the polishing of the back surface of the semiconductor wafer W is also performed such that its outer peripheral portion OUT remains, the strength of the semiconductor wafer W can be maintained in some measure even in the post-polishing process step. For instance, the warpage and cracking of the semiconductor wafer W in the process step of forming the collector region 35 and collector electrode 37 can be prevented.

Thereafter, the semiconductor wafer W is cut (diced) along the scribe areas SA to form a plurality of chips CA. This dicing step will be described below in detail.

Figure 16:
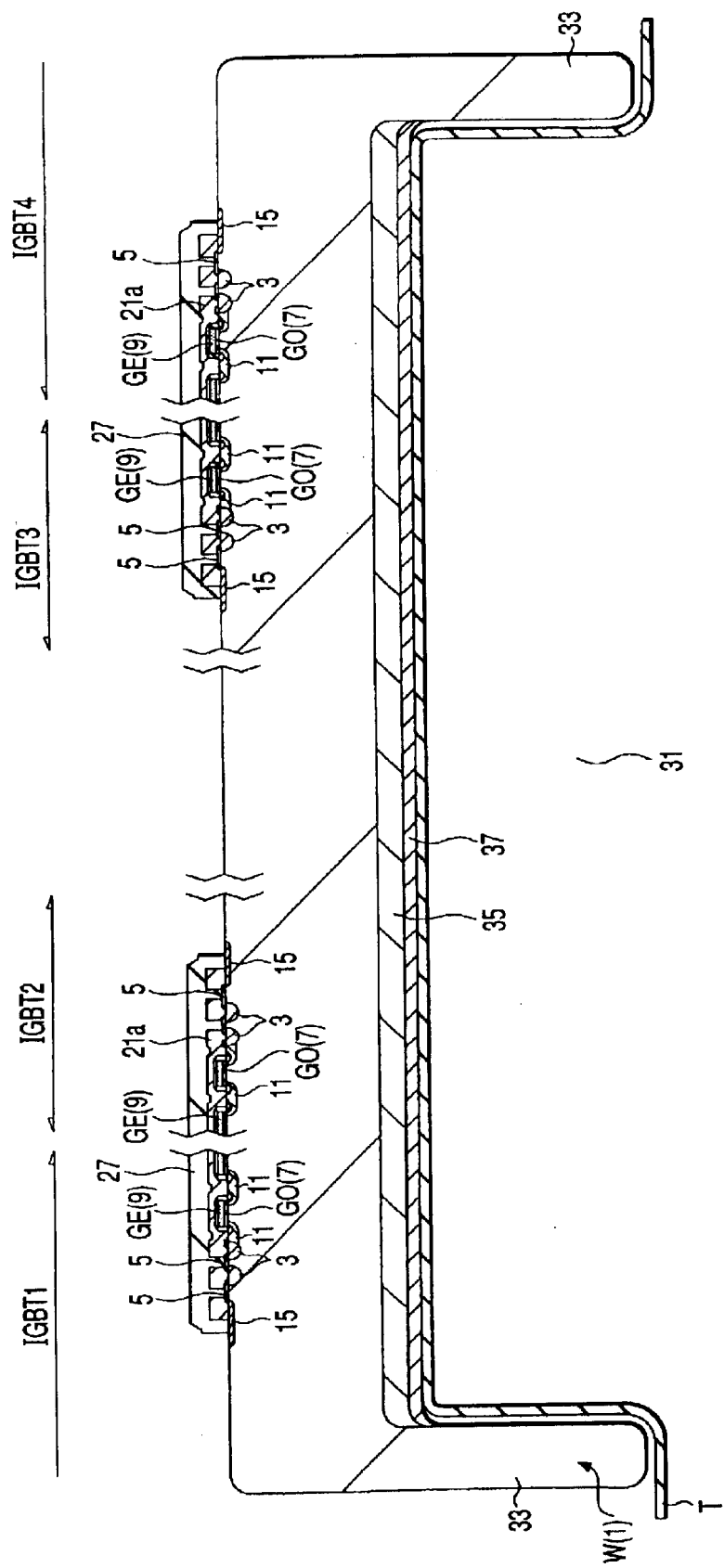
FIG. 16 is a fragmentary cross-sectional view of the wafer (substrate), which depicts the method of manufacturing the semiconductor device, according to the first embodiment of the present invention.

A tape T is first bonded onto the back surface of the semiconductor wafer W as shown in FIG. 16. This is done to prevent the chips CA cut out form the semiconductor wafer W from coming apart.

Figure 17:
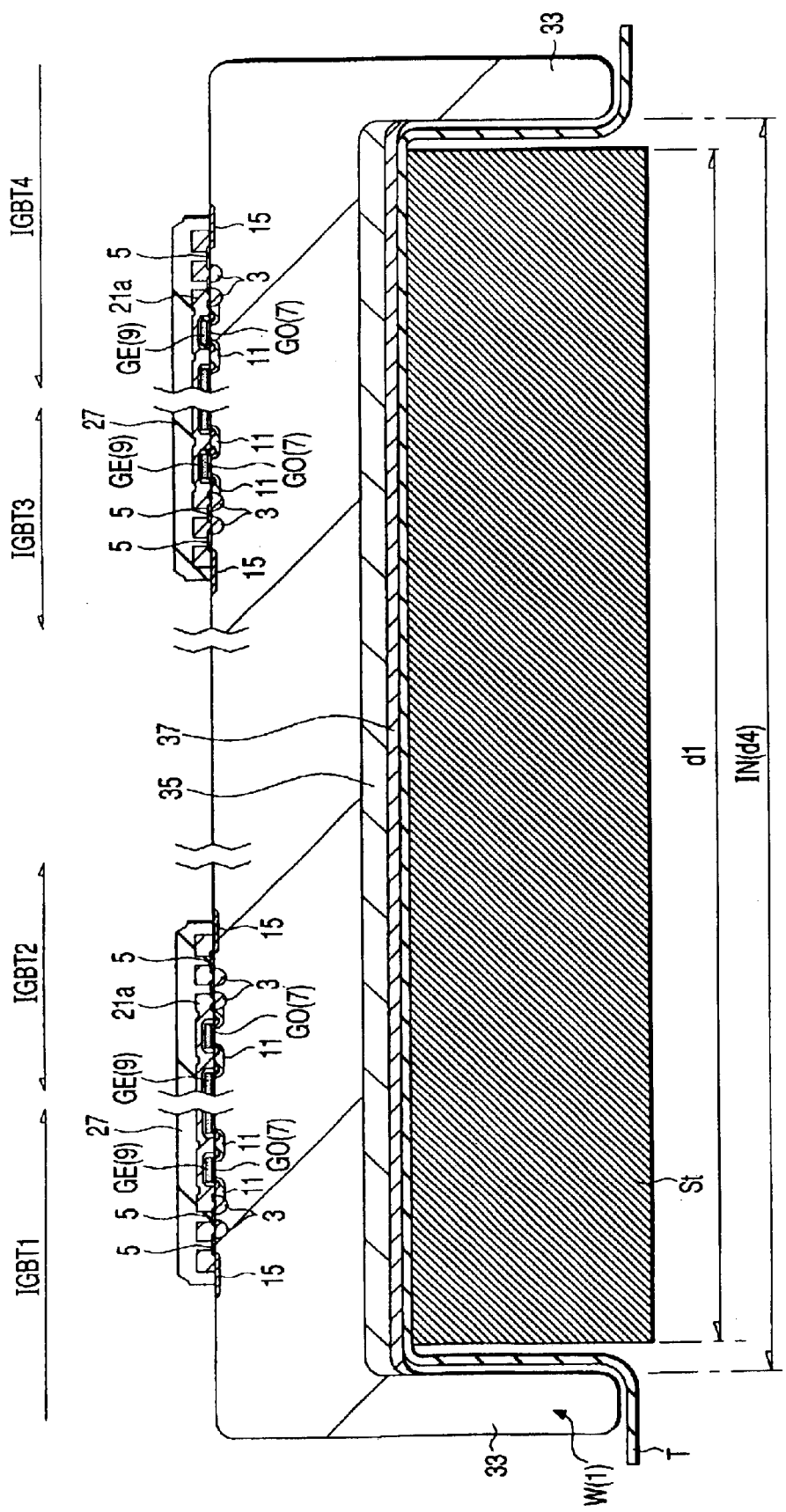
FIG. 17 is a fragmentary cross-sectional view of the wafer (substrate), which shows the method of manufacturing the semiconductor device, according to the first embodiment of the present invention.
Figure 18:
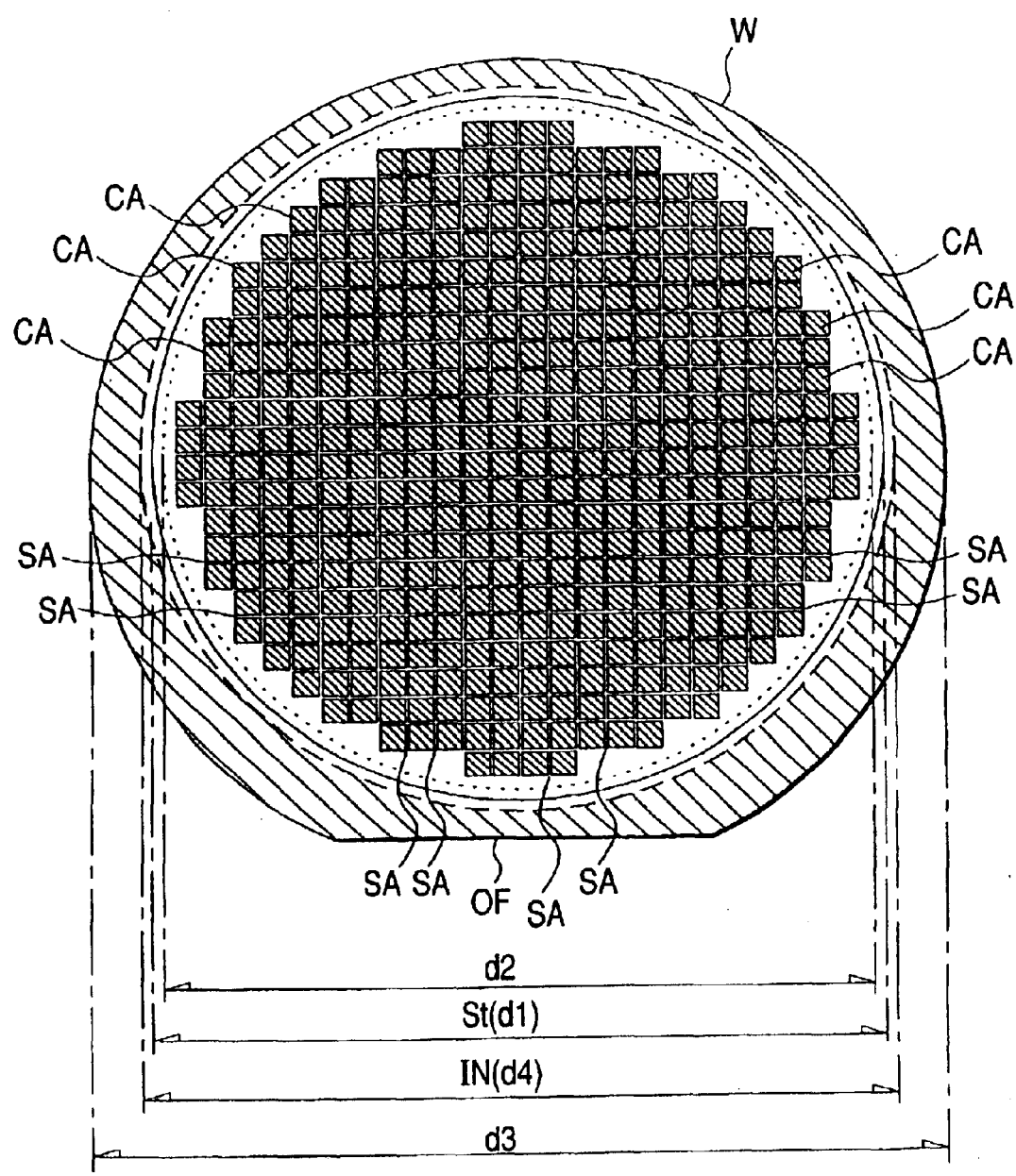
FIG. 18 is a fragmentary plan view of the wafer (substrate), which illustrates the method of manufacturing the semiconductor device, according to the first embodiment of the present invention.
Figure 41:
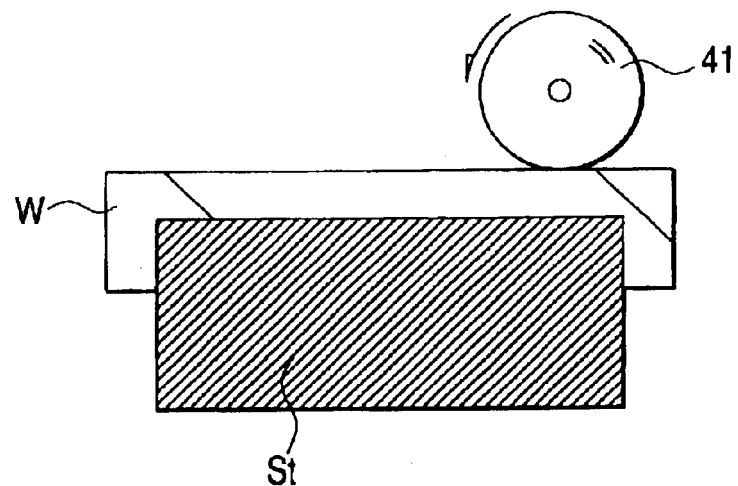
FIG. 41 is a cross-sectional view schematically showing a dicing apparatus used in a method of manufacturing a semiconductor device, according to an embodiment of the present invention.

Next, as shown in FIGS. 17 and 18, the semiconductor wafer W is mounted on a stage St (support table) of a dicing apparatus. At this time, the stage St is inserted into the internal area IN of the semiconductor wafer W, and the internal area IN of the back surface of the semiconductor wafer W is supported by the surface of the stage St. A schematic diagram of the dicing apparatus is shown in FIG. 41. Reference numeral 41 indicates a dicing blade.

Namely, as shown in FIGS. 17 and 18, the surface of the stage St is smaller than the internal area IN of the semiconductor wafer W, and a diameter d1 of the stage St is smaller than the diameter d4 of the internal area IN. The difference between the diameter d1 of the stage St and the diameter d4 of the internal area IN may preferably be set to 0.5 mm or more. This is because since the boundary between the peripheral portion of the back surface of the semiconductor wafer and the polished portion (recess 31) is made roundish, the stage St is not brought into close contact with the back surface of the semiconductor wafer when d1=d4, for example.

The stage St is set so as to be capable of supporting the semiconductor wafer W on its surface, and the height of the stage St is set so as to become larger than the depth of the recess defined in the back surface of the semiconductor wafer W. Incidentally, the diameter d1 of the stage St may preferably be larger than the diameter d2 of the minimum circle which surrounds the plurality of chip areas CA.

Figure 19:
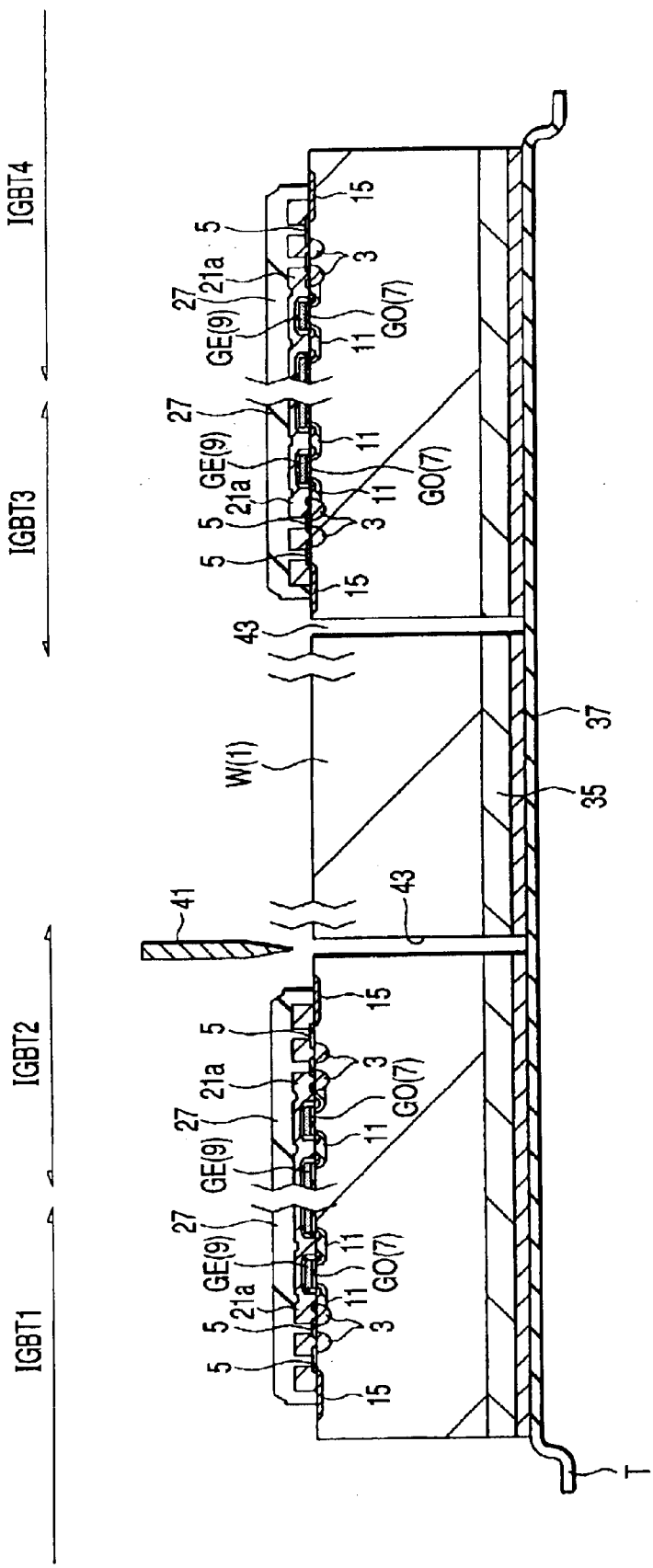
FIG. 19 is a fragmentary cross-sectional view of the wafer (substrate), which shows the method of manufacturing the semiconductor device, according to the first embodiment of the present invention.

Next, as shown in FIG. 19, a dicing blade 41 is pressed against the scribe areas SA of the semiconductor wafer W to form cut trenches or grooves 43.

Thus, since the dicing is performed in the supported state of the semiconductor wafer W at the stage St smaller than the internal area IN of the semiconductor wafer W in the present embodiment, the cracking of the semiconductor wafer W in such a step can be prevented. It is also possible to prevent shake of the semiconductor wafer at the dicing, and dicing displacements.

Since a mechanical force is applied to the semiconductor wafer W in such a dicing step, the semiconductor wafer W is apt to crack as compared with the above-described various steps.

Since, however, the plurality of chip areas CA are supported by the stage St in the present embodiment, the cracking of the semiconductor wafer W can be prevented.

Figure 40:
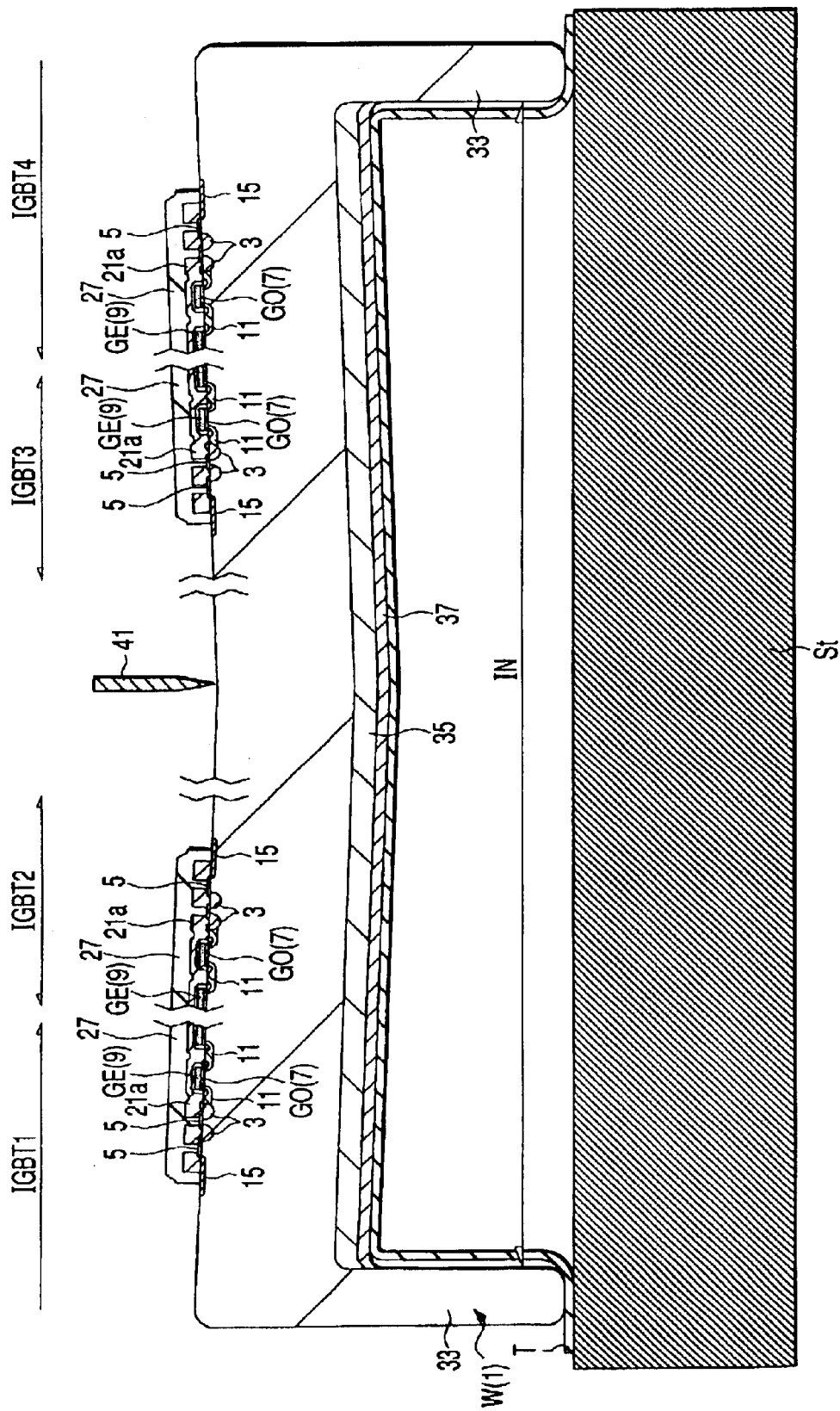
FIG. 40 is a fragmentary cross-sectional view of a wafer (substrate), which depicts a method of manufacturing a semiconductor device, for describing an effect of an embodiment of the present invention.

When the stage St is larger than the internal area IN of the semiconductor wafer W as shown in FIG. 40 by way of example, spacing is defined between the back surface of the semiconductor wafer W and the stage St. When the dicing blade 41 is pressed against the semiconductor wafer in such a state, the semiconductor wafer W is distorted due to its stress, and the cut areas collide with one another, for example, so that the dicing cannot be carried out with satisfactory controllability, and the cracking of the semiconductor wafer W occurs.

In the present embodiment on the contrary, the cracking of the semiconductor wafer W (chip areas CA) can be prevented and the dicing can be carried out with good controllability.

Figure 20:
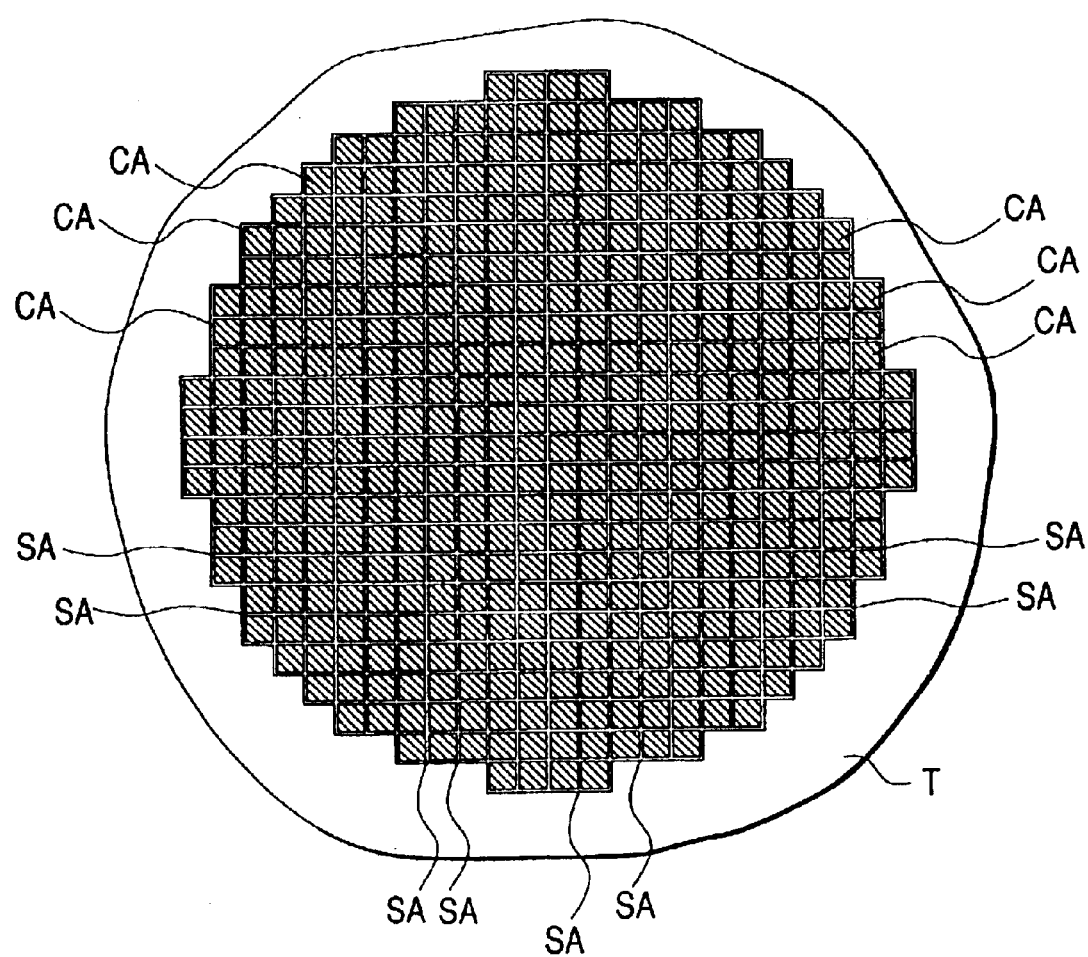
FIG. 20 is a fragmentary plan view of the wafer (substrate), which illustrates the method of manufacturing the semiconductor device, according to the first embodiment of the present invention.

Next, a portion lying outside the plurality of chip areas CA is cut off and peeled from the tape T (see FIG. 19). Namely, as shown in FIG. 20, the protrusion 33 at the outer peripheral portion OUT of the semiconductor wafer W is removed.

Thus, since the protrusion 33 at the outer peripheral portion OUT of the semiconductor wafer W is removed after the dicing in the present embodiment, processes in subsequent steps, e.g., a stretch step and a pickup step for the tape T become apt to be performed.

Figure 21:
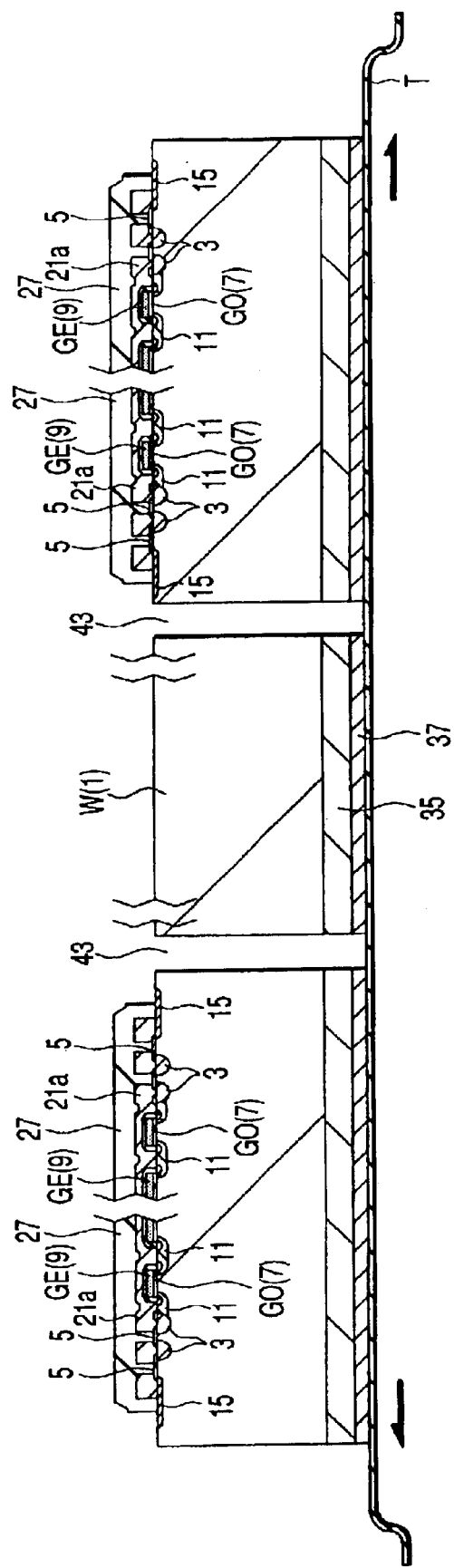
FIG. 21 is a fragmentary cross-sectional view of the wafer (substrate), which shows the method of manufacturing the semiconductor device, according to the first embodiment of the present invention.

Next, as shown in FIG. 21, the interval between the chip areas CA is increased by pulling the tape T, whereby the individual chip areas CA are perfectly separated from one another (Stretch).

Figure 22:
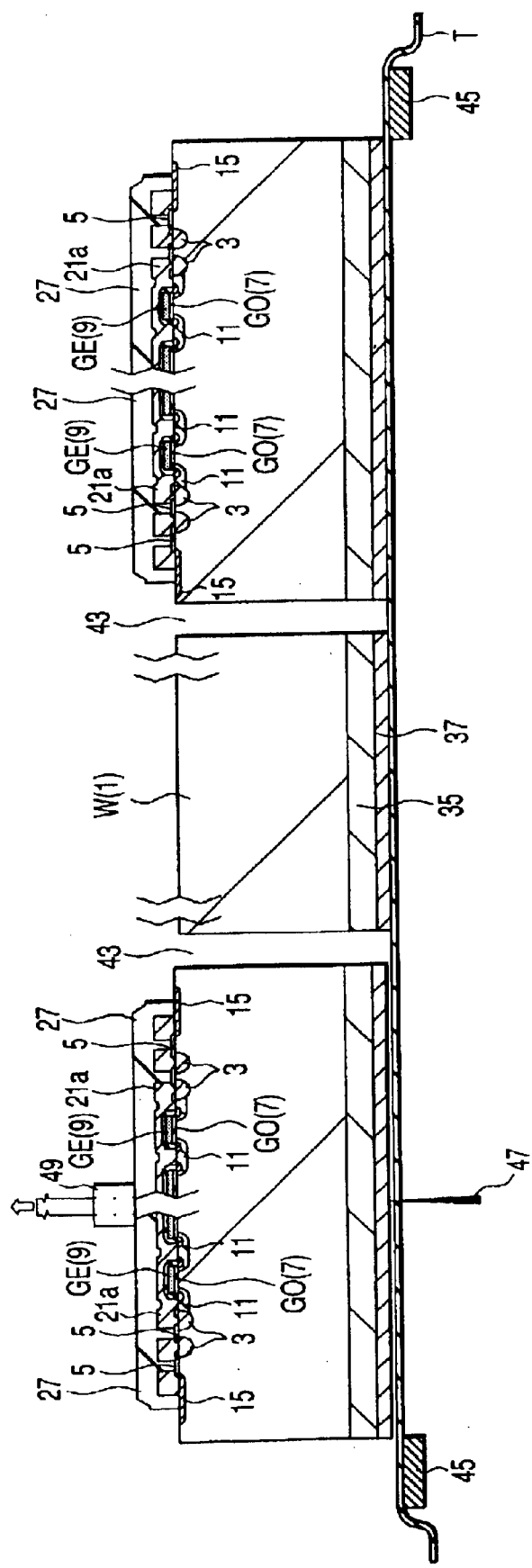
FIG. 22 is a fragmentary cross-sectional view of the wafer (substrate), which depicts the method of manufacturing the semiconductor device, according to the first embodiment of the present invention.

Next, as shown in FIG. 22, the end of the tape T equipped with the plurality of chips CA thereon is fixed to a ring 45. Further, a needle 47 is struck from the back surface of each chip area CA to peel off the chip area CA from the tape T, and the chip area CA is absorbed (picked up) from thereabove through a collet 49.

Incidentally, while the so-called full cut process for forming each groove 43 up to the back surface of the semiconductor wafer W is performed in the present embodiment, the cut grooves 43 may be formed to some midpoint of the thickness of the semiconductor wafer W as in the case of, for example, a semi-full cut or a half cut process.

While the tape T is bonded onto the back surface of the semiconductor wafer W in the present embodiment, the step of bonding the tape T thereto may be omitted. As the method of removing the protrusion 33 of the outer peripheral portion OUT of the semiconductor wafer W, there are considered various ones such as a method of roundly cutting the outer periphery of a semiconductor wafer W to remove a protrusion, a method of cutting only a portion protruded from a semiconductor wafer W while a dicing blade is being applied to the side wall of the semiconductor wafer W, a scraping method using a sand plaster, etc., in addition to the above method.

Figure 23:
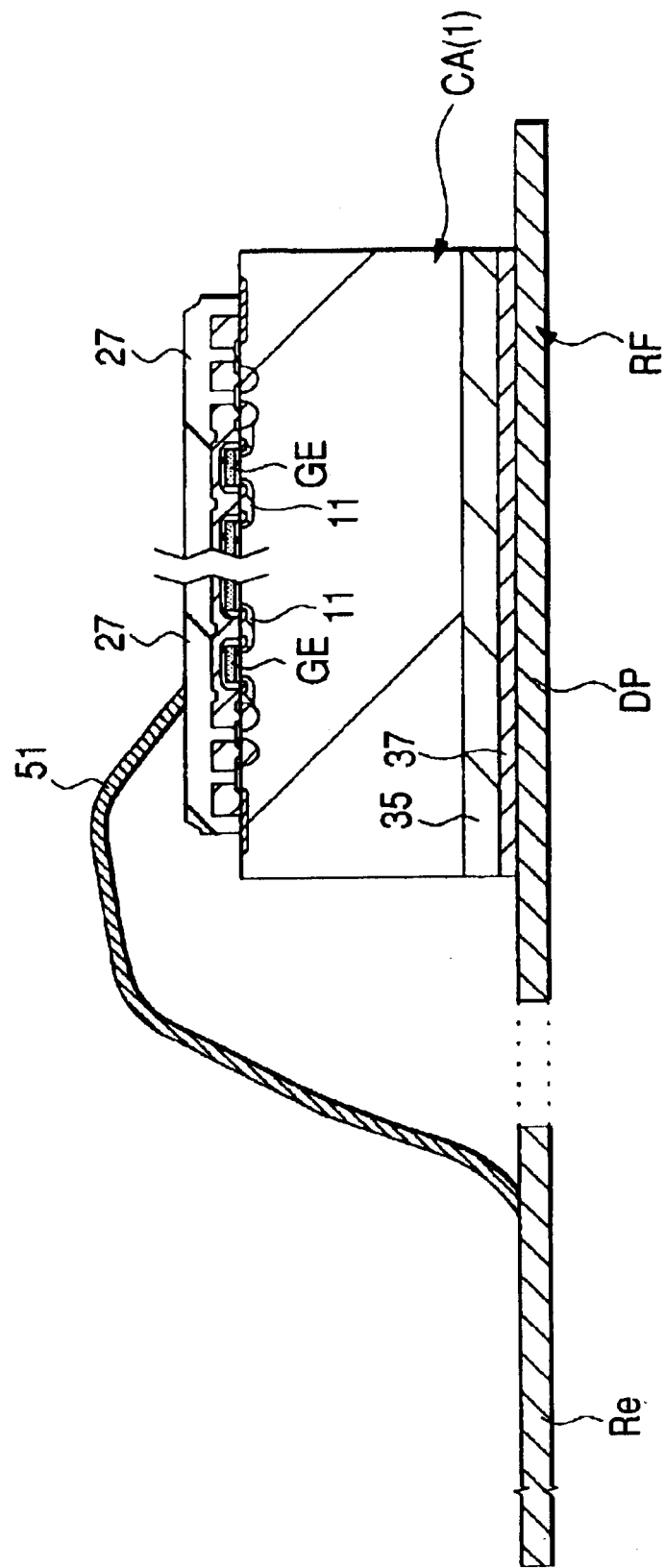
FIG. 23 is a fragmentary cross-sectional view of the substrate, which shows the method of manufacturing the semiconductor device, according to the first embodiment of the present invention.
Figure 24:
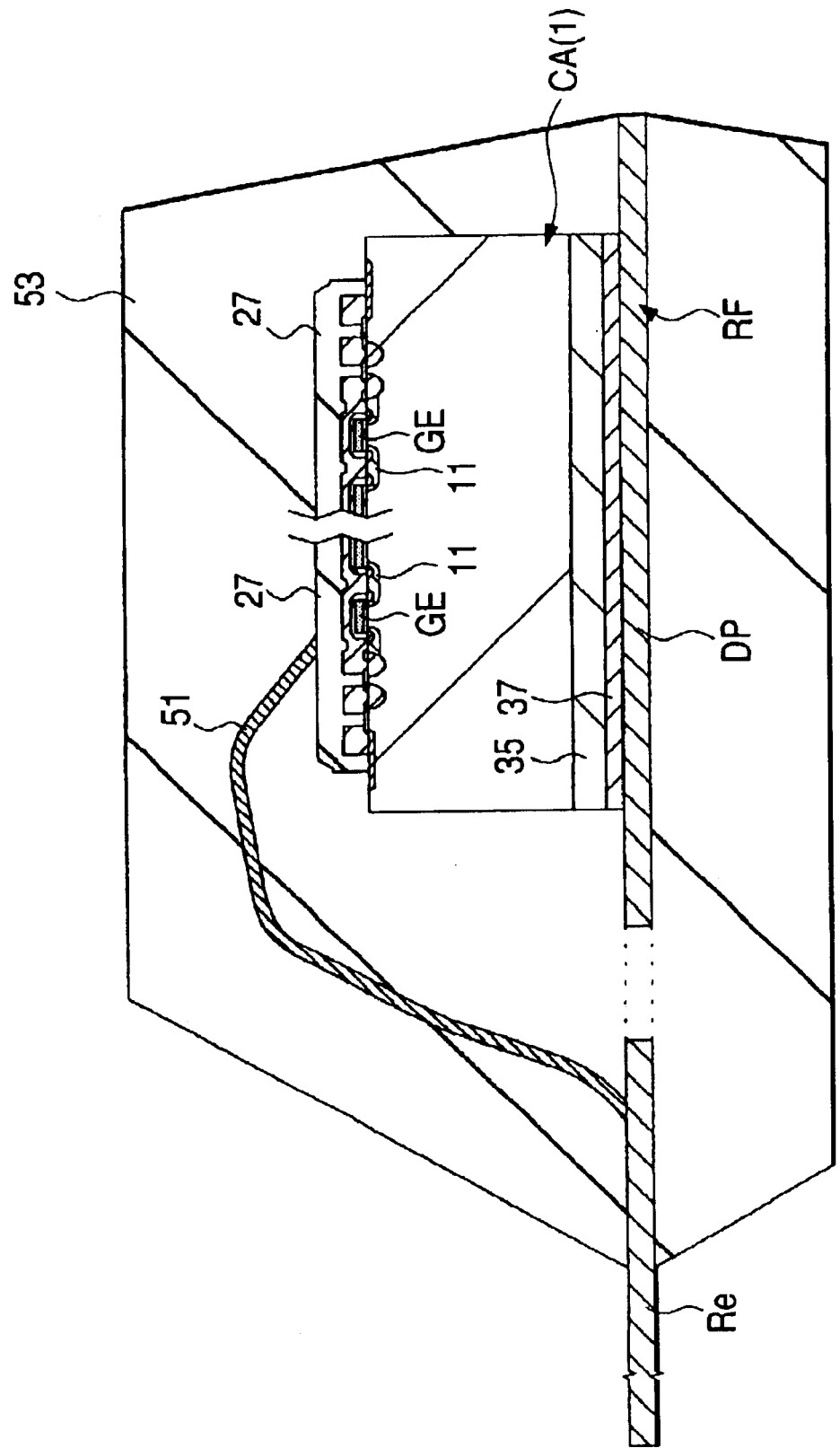
FIG. 24 is a fragmentary cross-sectional view of the substrate, which illustrates the method of manufacturing the semiconductor device, according to the first embodiment of the present invention.

Next, as shown in FIG. 23, a picked-up chip (die) CA is fixed onto a die pad DP of a lead frame RF, for example (die bonding). Next, each pad portion (not shown) on the surface of the chip CA and a reed Re are connected by a gold line 51 or the like (wire bonding). Further, the lead frame RF is held by a die or the like and a molten resin is injected into the die and cured to seal the peripheries of the chip CA and the metal line 51 with the resin 53. Next, the reed Re protruded from the resin 53 is shaped to a desired form as needed, whereby the corresponding semiconductor device is completed (see FIG. 24).

Incidentally, while the present embodiment has described, as an example, the resin encapsulated package, it is needless to say that forms of various packages such as a ceramic package, etc. can be adopted as an alternative to it.

According to the present embodiment in this way, the package can be formed thin since the chip CA (substrate 1) can be thinned. It is also possible to enhance the radiation characteristic of the device.

Figure 25:
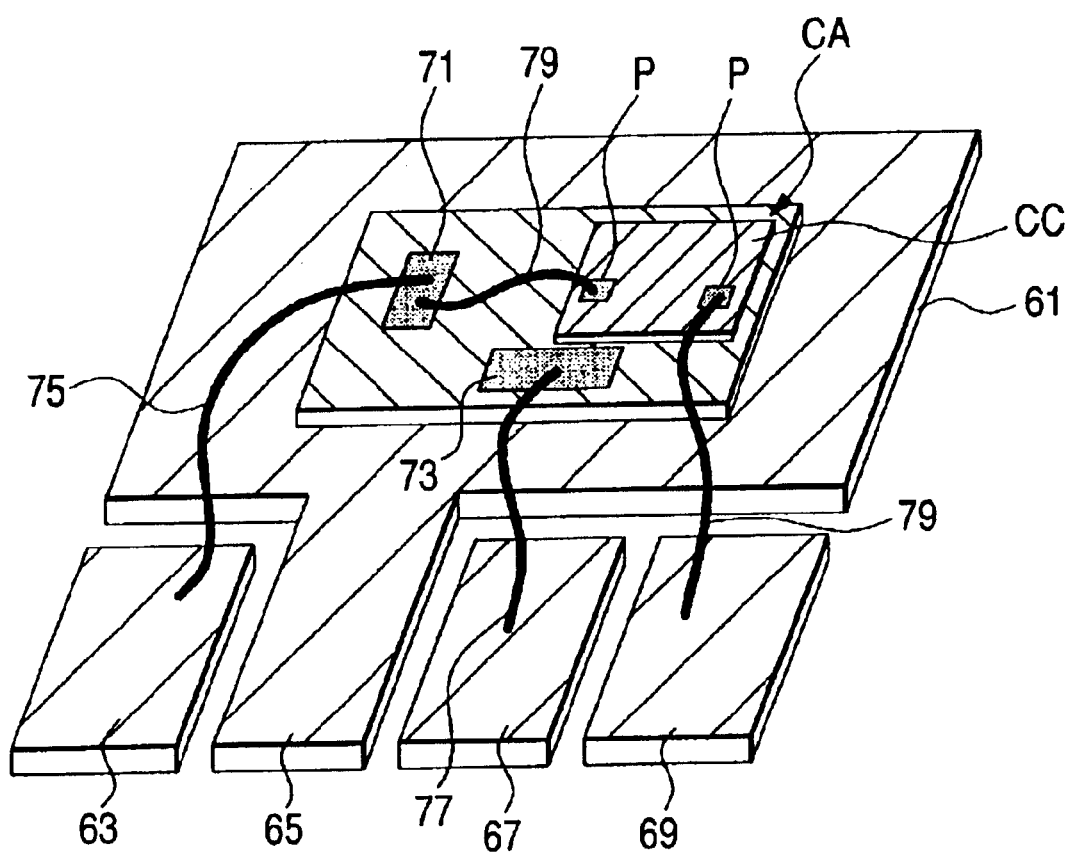
FIG. 25 is a fragmentary perspective view of the substrate and the like, which shows the method of manufacturing the semiconductor device, according to the first embodiment of the present invention.

As shown in FIG. 25 by way of example, a chip CA formed with an IGBT is mounted on a collector base substrate 61 and thereafter a control chip CC may be mounted on the chip CA.

Thus, according to the present embodiment, since the chip CA (substrate 1) can be thinned, the total thickness of the chip can be reduced even if the chip is brought into lamination form. The chip is suitable for use in small-sized and thinned devices such as a cellular phone, a notebook computer, etc. in particular.

Incidentally, reference numeral 63 in the drawing indicates a gate terminal, and reference numeral 65 indicates a collector terminal, which is connected to a collector electrode on the back surface of the chip CA. Reference numeral 67 indicates an emitter terminal, and reference numeral 69 indicates a control terminal, respectively. Reference numeral 71 indicates a gate pad on the chip CA, and reference numeral 73 indicates an emitter pad respectively. Reference numeral 75 indicates a gate wire, reference numeral 77 indicates an emitter wire, and reference numerals 79 indicate control wires for connecting pads P on the surface of the control chip CC and external terminals or the like, respectively.

(Second Embodiment)

In the first embodiment, the passivation film 27 corresponding to the top layer film of the films deposited on the surface of the semiconductor wafer W in the wafer state is formed and thereafter the back surface of the semiconductor wafer W is polished. However, the back surface may be polished after steps to be shown below.

(1) A polycrystal silicon film 9 formed as gate electrodes GE is deposited by a CVD method and thereafter the back surface of the semiconductor wafer W is polished. Incidentally, since this polishing of back surface can be done according to a step similar to the back-surface polishing used in the first embodiment, its detailed description will be omitted.

Namely, the back surface of the semiconductor wafer W is polished to thereby depress an internal area IN of the semiconductor wafer W, thereby forming a recess (concave portion) 31.

Since the thickness of the semiconductor wafer W is ensured until the deposition of the polycrystal silicon film 9 even in this case, the semiconductor wafer W can be prevented from cracking and distortion, and the characteristic of each semiconductor element formed on its main surface can be enhanced. It is possible to particularly prevent warpage of the semiconductor wafer due to the application of a film stress upon lamination of the polycrystal silicon film 9 on the semiconductor wafer W. Since only the internal area IN of the semiconductor wafer W is back-polished and a protrusion 33 remains at an outer peripheral portion OUT, the strength of the semiconductor wafer W can be maintained even in each subsequent step (see FIGS. 10 and 11).

Incidentally, the description of each subsequent step will be omitted because each IGBT can be formed according to a step similar to the first embodiment. However, the step of forming a collector region 35 and a collector electrode 37 may be performed after the polishing of the back surface of the semiconductor wafer W. For example, such a step is not necessarily limited to execution subsequent to the formation of the passivation film 27 as in the first embodiment.

After the formation of the IGBT, the semiconductor wafer W is mounted on a stage St smaller than the internal area IN of the semiconductor wafer W and thereafter subjected to dicing in a manner similar to the first embodiment.

Figure 42:
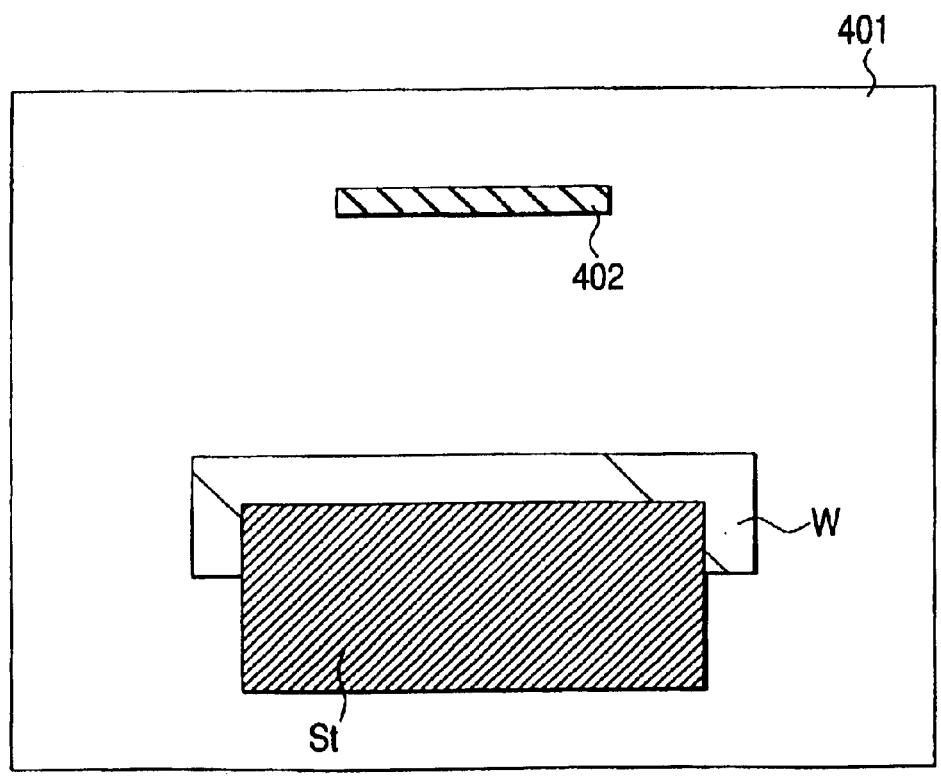
FIG. 42 is a cross-sectional view schematically illustrating a processing apparatus used in a method of manufacturing a semiconductor device, according to an embodiment of the present invention.

The process of mounting the semiconductor wafer W on such a stage St is not limited to the dicing step. This processing can be performed similarly even in a step using a stepper apparatus used when a desired pattern is transferred onto a resist film in a photolithography step, or a sputtering apparatus or system used for film deposition. Namely, a semiconductor wafer W is mounted on a stage St lying within each of these apparatuses and smaller than an internal area IN of the semiconductor wafer W, and processing is executed. A schematic diagram of each of these apparatuses is shown in FIG. 42. Reference numeral 401 indicates a processing chamber. A member 402 such as a target used in sputter, a reticle on which a transferred pattern is drawn, or the like is disposed over the semiconductor wafer W. Fixing the semiconductor wafer W onto the stage St in this way makes it easy to perform these processes. Further, warpage and cracking of the semiconductor wafer W can be reduced.

(2) After the deposition of an aluminum film 21 which serves as an emitter electrode, the back surface of the semiconductor wafer W is polished. Incidentally, since this polishing of back surface can be performed in a step similar to the back-surface polishing employed in the first embodiment, its detailed description will be omitted.

Namely, the back surface of the semiconductor wafer W is polished to thereby depress an internal area IN of the semiconductor wafer W, thereby forming a recess (concave portion) 31.

Since the thickness of the semiconductor wafer W is ensured until the deposition of the aluminum film 21 even in this case, the semiconductor wafer W can be prevented from cracking and distortion, and the characteristic of each semiconductor element formed on its main surface can be enhanced. It is possible to particularly prevent warpage and cracking of the semiconductor wafer W although a large stress is applied to the semiconductor wafer W after the deposition of a metal film such as an aluminum film or the like. Since only the internal area IN of the semiconductor wafer W is back-polished and a protrusion 33 remains at an outer peripheral portion OUT, the strength of the semiconductor wafer W can be maintained even in a subsequent step (see FIGS. 10 and 11).

Incidentally, the detailed description of each subsequent step will be omitted because each IGBT can be formed according to a step similar to the first embodiment. However, the step of forming a collector region 35 and a collector electrode 37 may be performed after the polishing of the back surface of the semiconductor wafer W. For example, such a step is not necessarily limited to after the formation of the passivation film 27 as in the first embodiment.

After the formation of the IGBT, the semiconductor wafer W is mounted on a stage St smaller than the internal area IN of the semiconductor wafer W and thereafter subjected to dicing in a manner similar to the first embodiment.

The process of mounting the semiconductor wafer W on such a stage St is not necessarily limited to the dicing step. This processing can be performed similarly even in a step using a stepper apparatus used upon transfer of a desired pattern, e.g., a pattern for an emitter electrode onto a resist film.

(Third Embodiment)

In a third embodiment, a back surface of a semiconductor wafer W was polished before the formation of a passivation film 27. In this case, a collector region 35 and a collector electrode 37 can be formed with various timings subsequent to this polishing of back surface.

A method of manufacturing a semiconductor device, according to the present embodiment will be described below.

Figure 26:
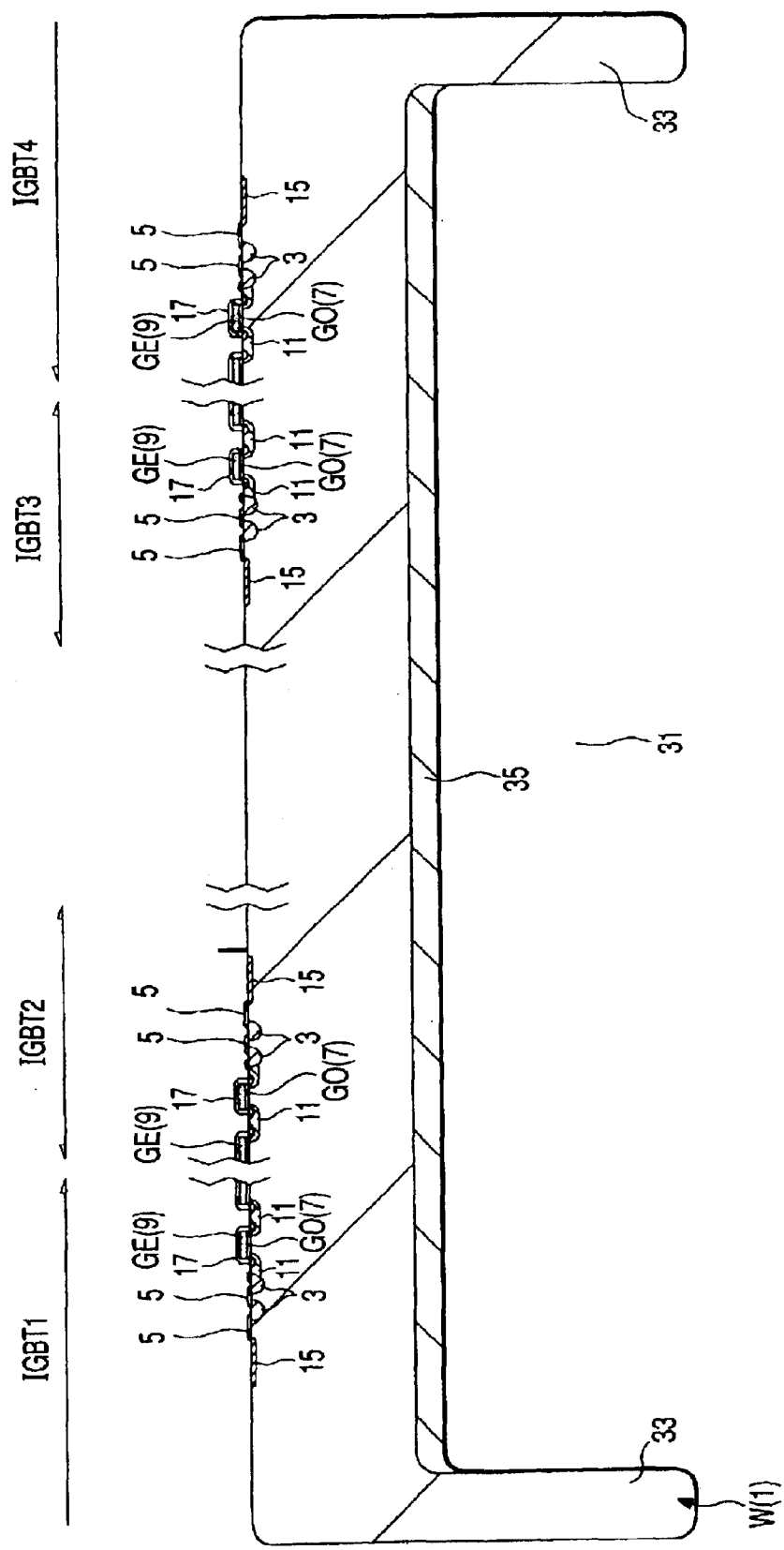
FIG. 26 is a fragmentary cross-sectional view of a wafer (substrate), which shows a method of manufacturing a semiconductor device, according to a third embodiment of the present invention.

The polycrystal silicon film 9 formed as the gate electrodes GE, which has been described in the paragraph (1) of the second embodiment, for example, is deposited by the CVD method, and thereafter the back surface of the semiconductor wafer W is ground. Next, as shown in FIG. 26, base regions 11 and emitter regions 13 are formed, and silicon oxide films 17 are formed. Next, connecting holes are formed on the emitter regions 13 in the silicon oxide films 17. A collector region 35 is next formed on the back surface of the semiconductor wafer W.

Figure 27:
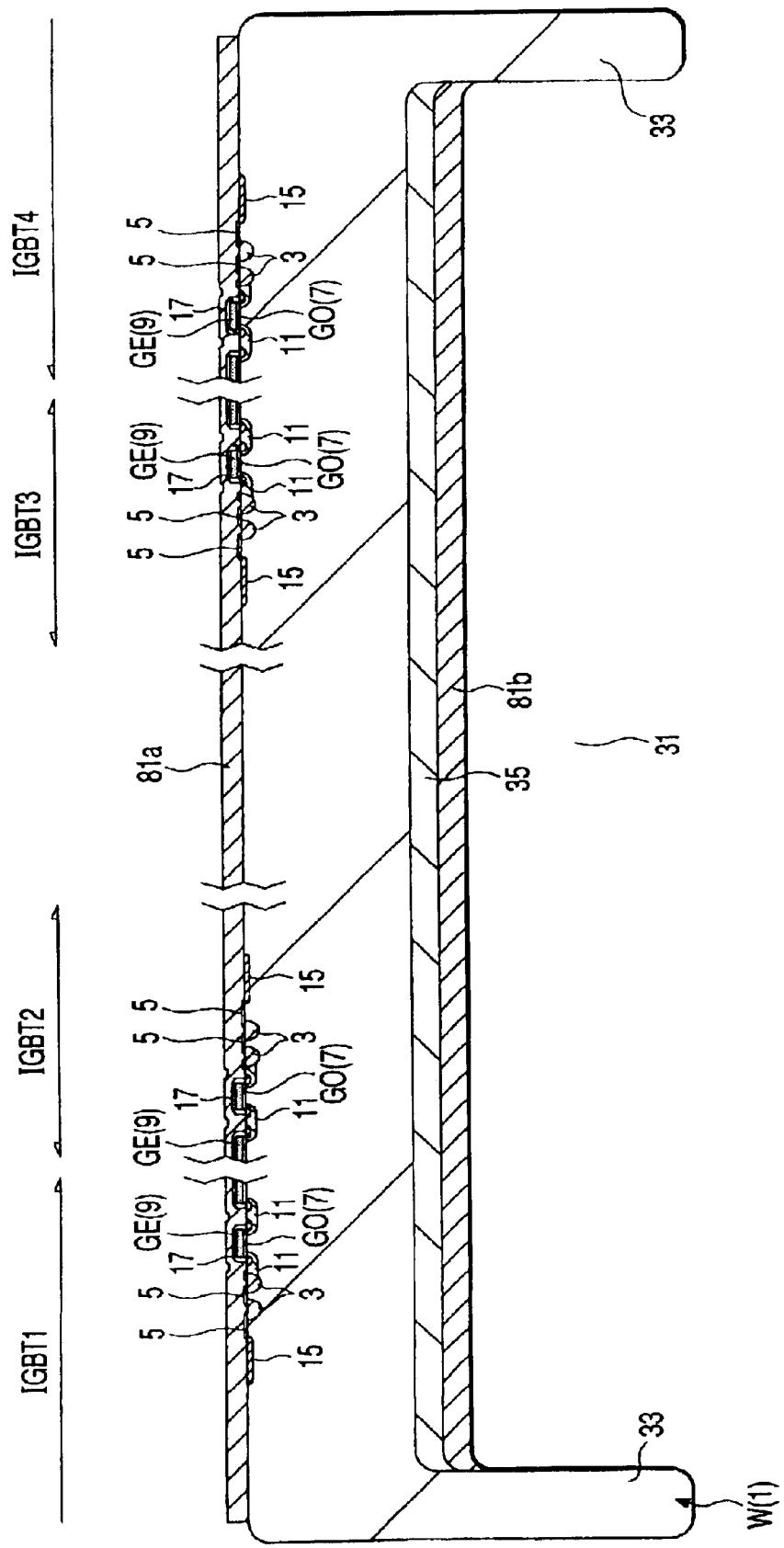
FIG. 27 is a fragmentary cross-sectional view of the wafer (substrate), which illustrates the method of manufacturing the semiconductor device, according to the third embodiment of the present invention.

Thereafter, as shown in FIG. 27, an aluminum film 81a, which serves as an emitter electrode, is deposited on the surface of the semiconductor wafer W and at the same time an aluminum film 81b, which serves as a collector electrode, is deposited on the back surface of the semiconductor wafer W.

In the present embodiment as described above, metal films large in film stress, such as the aluminum films or the like are formed on the surface and back surface of the semiconductor wafer W in the same step. Therefore, a film stress is canceled out by these films, and warpage and cracking of the semiconductor wafer W can be prevented.

Incidentally, the detailed description of subsequent steps will be omitted because each IGBT can be formed according to a step similar to the first embodiment. After the formation of the IGBT, the semiconductor wafer W is mounted on a stage St smaller than an internal area IN of the semiconductor wafer W and thereafter subjected to dicing in a manner similar to the first embodiment.

(Fourth Embodiment)

While the first embodiment has described, as an example, each IGBT used as the element formed on the main surface of the semiconductor wafer W, elements such as complementary MISFETs (Metal Insulator Semiconductor Field Effect Transistors) constituting a logical circuit, etc. may be formed.

A method of manufacturing a semiconductor device, according to the present embodiment will be explained below.

FIGS. 28 through 33 are respectively fragmentary cross-sectional views of a semiconductor wafer, which show a method of manufacturing a semiconductor device, according to a fourth embodiment of the present invention. Incidentally, the semiconductor wafer W formed with the semiconductor device according to the present embodiment is similar to one described while referring to FIG. 1 in the first embodiment. Namely, complementary MISFETs are formed in the chip areas CA shown in FIG. 1.

Figure 28:
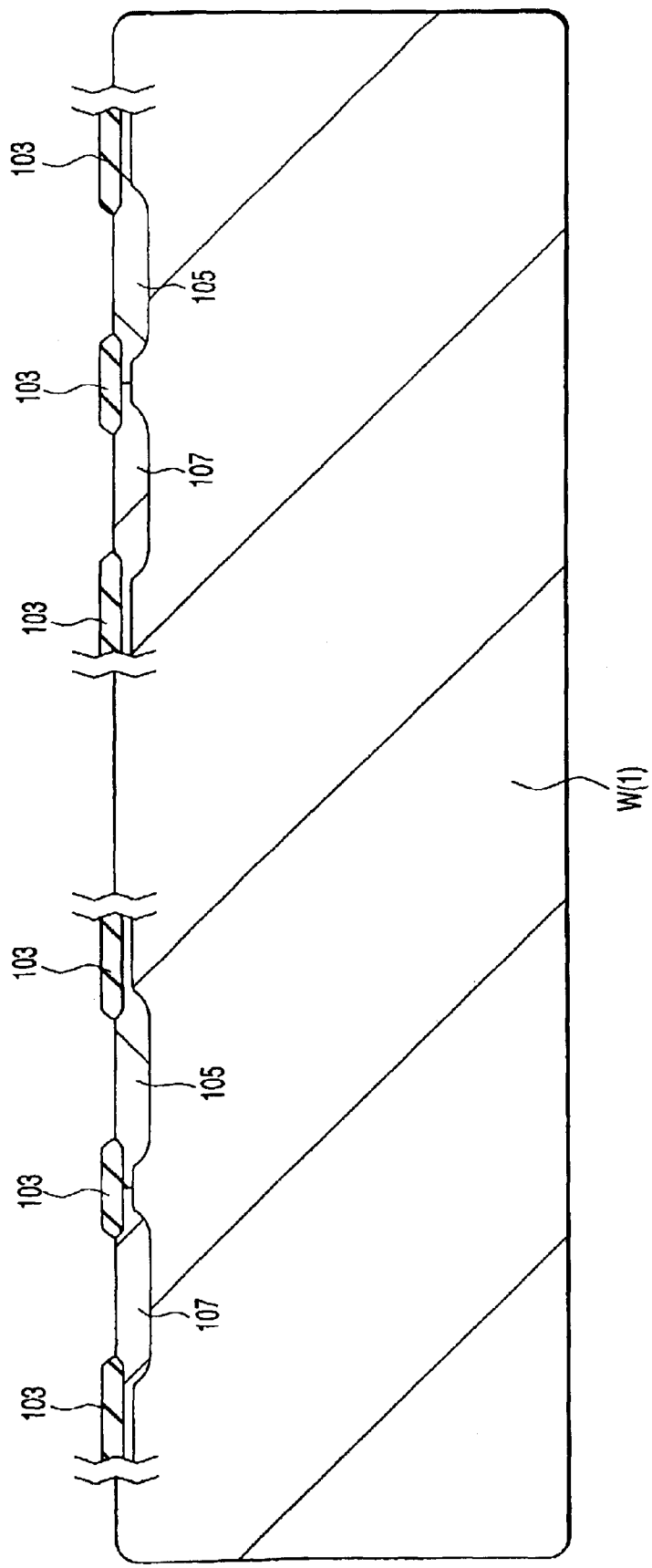
FIG. 28 is a fragmentary cross-sectional view of a wafer (substrate), which shows a method of manufacturing a semiconductor device, according to a fourth embodiment of the present invention.

As shown in FIG. 28, a semiconductor wafer W (semiconductor substrate 1) made up of p-type monocrystal silicon is prepared, and a silicon oxide film is selectively formed by a LOCOS (Local Oxidation of Silicon) method with a silicon nitride film (not shown) on the semiconductor wafer W as a mask to form device isolations or device isolation films 103.

Next, an n-type impurity is injected into the semiconductor wafer W and thereafter diffused to form n-type wells 105. A p-type impurity is injected into the semiconductor wafer W and thereafter diffused to form p-type wells 107.

Figure 29:
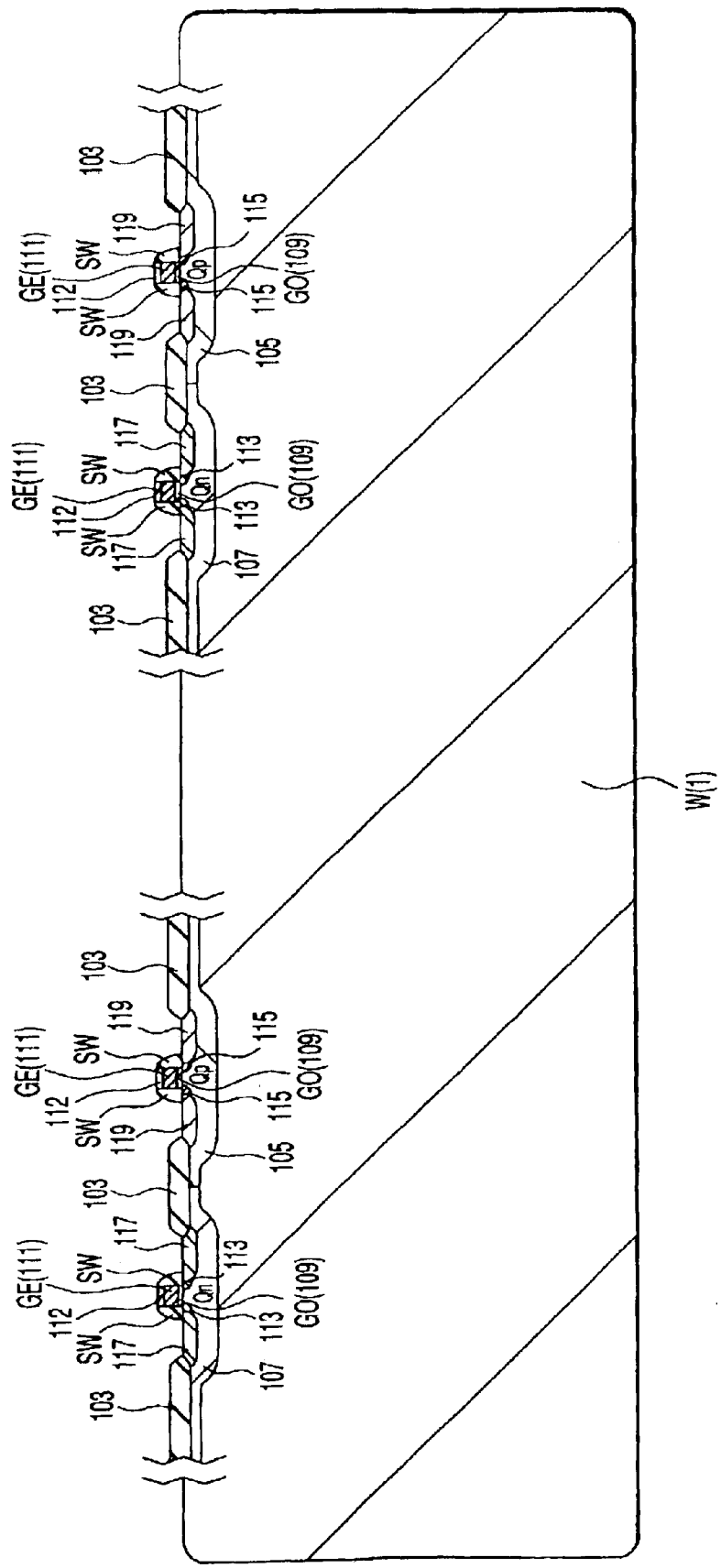
FIG. 29 is a fragmentary cross-sectional view of the wafer (substrate), which depicts the method of manufacturing the semiconductor device, according to the fourth embodiment of the present invention.

Next, as shown in FIG. 29, the surface of the semiconductor wafer W is thermally-oxidized to form a thermal oxide film 109. Further, a polycrystal silicon film 111 is deposited thereover as a conductive film by a CVD method. Furthermore, a silicon nitride film 112 is deposited over it as an insulating film by the CVD method. With a resist film (not shown) above the polycrystal silicon film 111 as a mask, the thermal oxide film 109 and the polycrystal silicon film 111 or the like are next etched to form gate electrodes GE and gate oxide film GO provided therebelow.

Next, an n-type impurity is injected into both sides of the gate electrode GE of each p-type well 107 and diffused thereto to form n$^-$-type semiconductor regions 113. A p-type impurity is injected into both sides of the gate electrode GE of each n-type well 105 and diffused thereto to form p$^-$-type semiconductor regions 115.

Next, a silicon nitride film is deposited on the semiconductor wafer W as an insulating film by the CVD method, for example and anisotropically dry-etched to form sidewall films SW on side walls of each gate electrode GE.

Next, an n-type impurity is injected into both sides of the gate electrode GE of each p-type well 107 and diffused thereto to form n$^+$-type semiconductor regions 117. A p-type impurity is injected into both sides of the gate electrode GE of each n-type well 105 and diffused thereto to form p$^+$-type semiconductor regions 119.

In steps described up here, n channel type MISFETs Qn and p channel type MISFETs Qp (complementary MISFETs) each having LDD-type source and drain regions are formed.

Figure 30:
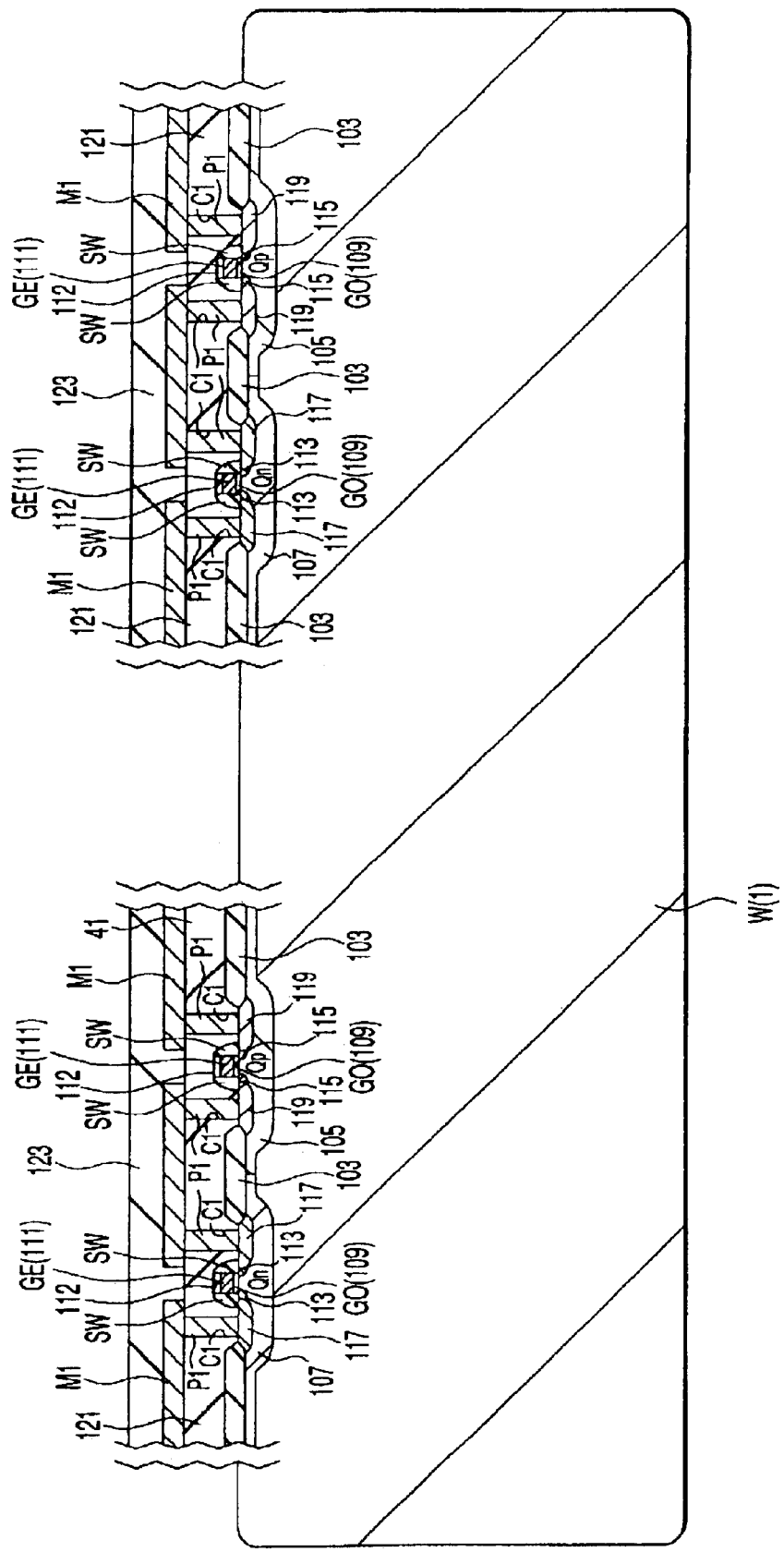
FIG. 30 is a fragmentary cross-sectional view of the wafer (substrate), which shows the method of manufacturing the semiconductor device, according to the fourth embodiment of the present invention.

Next, as shown in FIG. 30, a silicon oxide film 121 is deposited over these MISFETs as an insulating film, and the surface thereof is planarized as needed. Thereafter, the silicon oxide film 121 above the n$^+$-type semiconductor regions 117, the p$^+$-type semiconductor regions 111, etc. is removed to form contact holes C1.

Next, a tungsten (W) film is deposited over the silicon oxide film 121 including the interiors of the contact holes C1 as a conductive film. The W film lying outside the contact holes is removed by a CMP (Chemical Mechanical Polishing) method to form plugs P1.

Further, the W film is deposited on the plugs P1 and the silicon oxide film 121 as a conductive film and then patterned to desired forms, thereby forming first layer wirings M1.

Thereafter, a passivation film (protective film) 123 comprising a laminated film or the like of a silicon oxide film and a silicon nitride film is formed on the first layer wirings M1. Incidentally, the step of further forming an insulating film, plugs and wirings on the first layer wirings M1 is repeated to form a multilayered wiring and thereafter the passivation film 123 may be formed.

Figure 31:
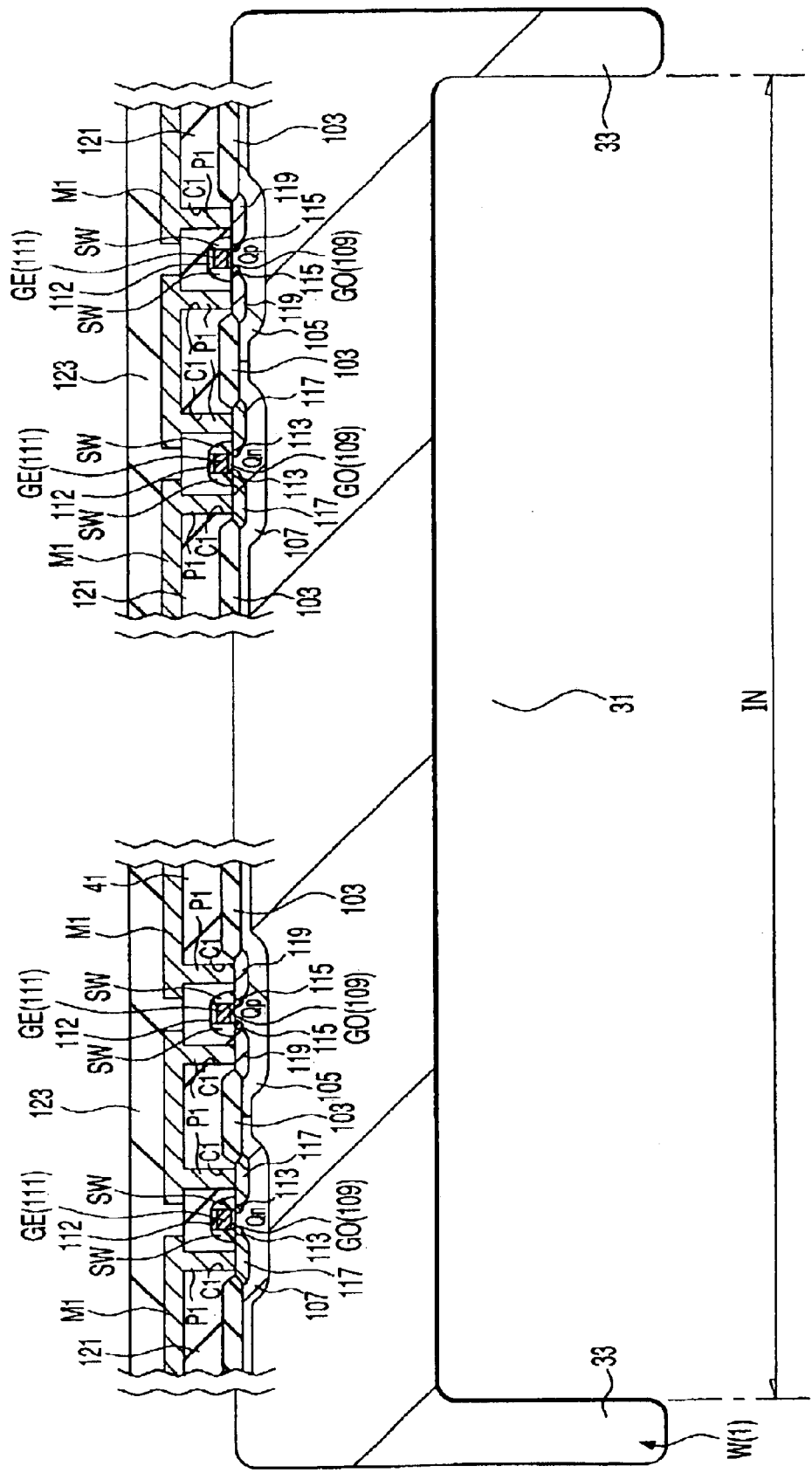
FIG. 31 is a fragmentary cross-sectional view of the wafer (substrate), which illustrates the method of manufacturing the semiconductor device, according to the fourth embodiment of the present invention.
Figure 32:
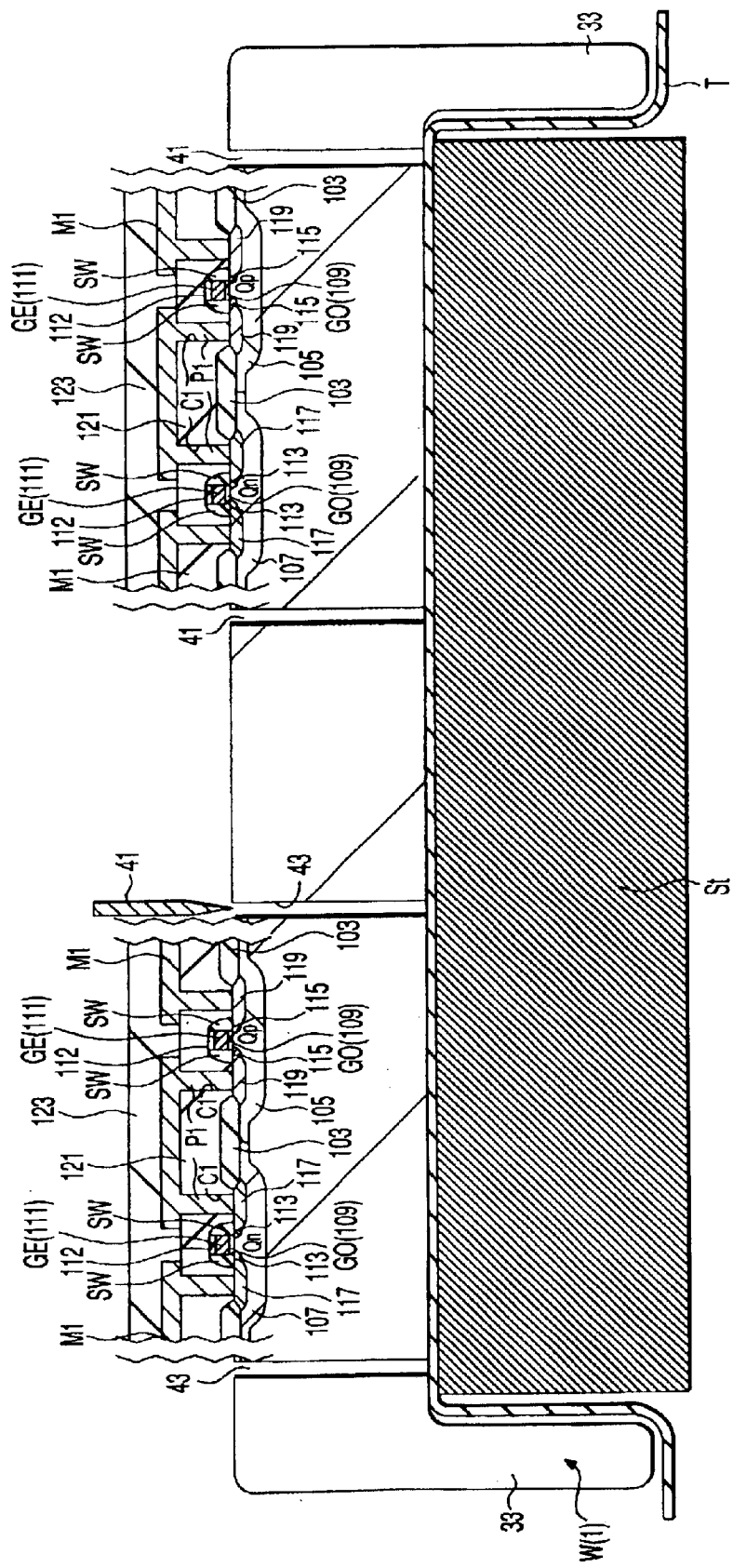
FIG. 32 is a fragmentary cross-sectional view of the wafer (substrate), which shows the method of manufacturing the semiconductor device, according to the fourth embodiment of the present invention.
Figure 33:
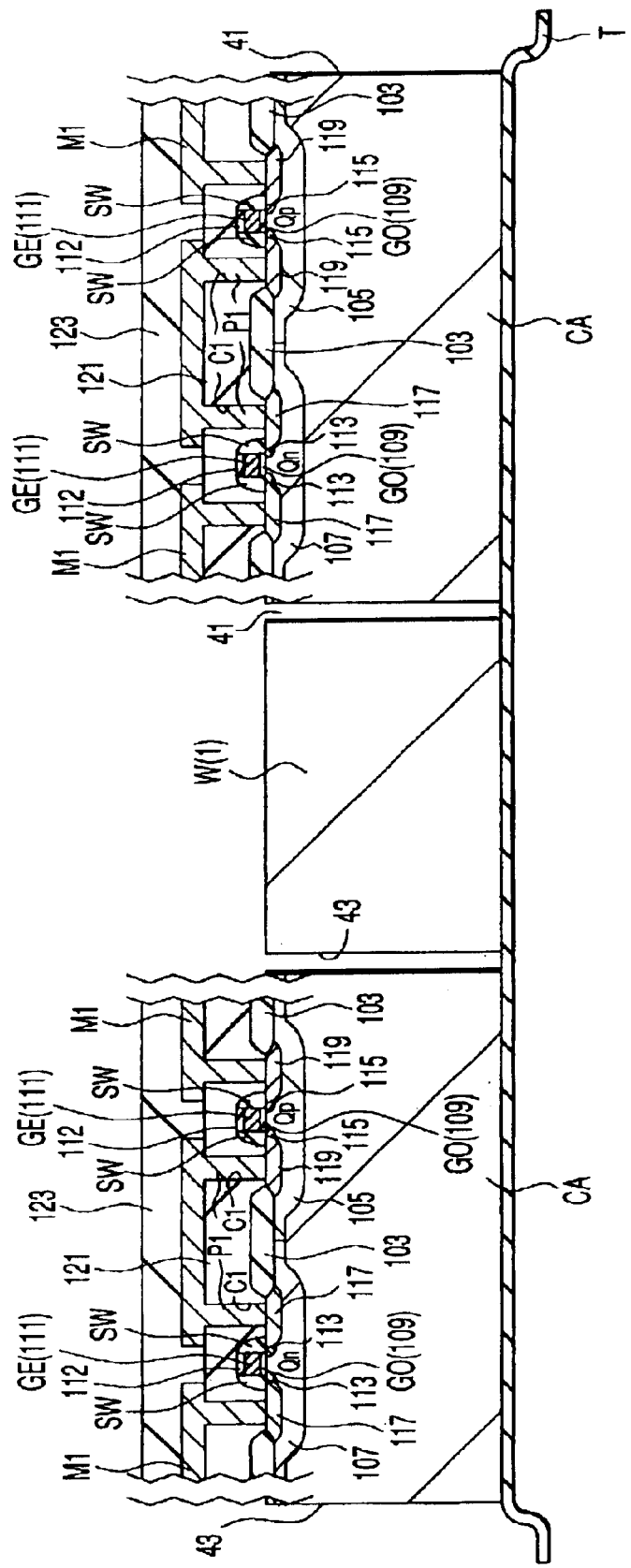
FIG. 33 is a fragmentary cross-sectional view of the wafer (substrate), which depicts the method of manufacturing the semiconductor device, according to the fourth embodiment of the present invention.

Afterwards, as shown in FIG. 31, the back surface of the semiconductor wafer W is polished in a manner similar to the first embodiment to thereby depress an internal area IN of the semiconductor wafer W. Further, the semiconductor wafer W is mounted on a stage St smaller than the internal area IN of the semiconductor wafer W (see FIG. 32) and subjected to dicing to thereby form cut trenches or grooves 43 (see FIG. 33). Incidentally, a tape T is bonded onto the back surface of the semiconductor wafer W in advance before dicing.

Since the thickness of the semiconductor wafer W is ensured before the polishing of the back surface even in the present embodiment in this way, the semiconductor wafer can be prevented from cracking and distortion, and the characteristic of each semiconductor element formed on its main surface can be enhanced. A semiconductor wafer W having a large bore diameter can be used and yields can be enhanced. Further, a TAT can be shortened.

Further, since only the internal area IN of the semiconductor wafer W is back-polished and a protrusion 33 remains at an outer peripheral portion OUT thereof, the strength of the semiconductor wafer W can be maintained even in subsequent steps.

Thus, the present embodiment has an effect even upon formation of elements such as the complementary MISFETs or the like, in which currents flow in a transverse direction with respect to the substrate. Accordingly, the present invention can be widely applied to an IC card and an LSI having such elements.

Since the dicing is done in a state in which the semiconductor wafer W is supported on the stage St smaller than the internal area IN of the semiconductor wafer W, the present embodiment can bring about an effect such as the ability to prevent cracking of the semiconductor wafer W in such a step, which is similar to the first embodiment or the like.

Thereafter, a portion lying outside the plurality of chip areas CA is cut in a manner similar to the first embodiment. The protrusion 33 at the outer peripheral portion OUT of the semiconductor wafer W is removed and the tape T is pulled to thereby pick up chips. Next, they are transferred onto a lead frame RF and subjected to die bonding and wire bonding or the like. Further, the chips CA and the like are sealed with a resin.

Incidentally, the back surface of the semiconductor wafer W is polished after the formation of the passivation film 123 corresponding to the top layer film of the films deposited over the surface of the semiconductor wafer W in the wafer state in the present embodiment. However, the back surface may be polished after the deposition of a metal film constituting the first layer wirings M1, for example.

When the multilayered wiring is formed, the back surface may be polished after the formation of an interlayer insulating film for covering the top of the wiring. Since the wiring is covered with the insulating film in this case, it is possible to prevent elements and wirings or the like from breaking down and being contaminated by foreign materials or the like even if the surface of the semiconductor wafer W is placed as the lower side and the back surface thereof is polished, for example. The semiconductor wafer may be supported by the stage St smaller than the internal area TN of the semiconductor wafer W so that exposure, deposition, or injection of an impurity, etc. are performed.

(Fifth Embodiment)

The semiconductor elements such as the IGBT, MISFET, etc. described in detail in the first and fourth embodiments may be formed at the bottom of a convex portion (recess) defined in the surface of the semiconductor wafer W.

Figure 34:
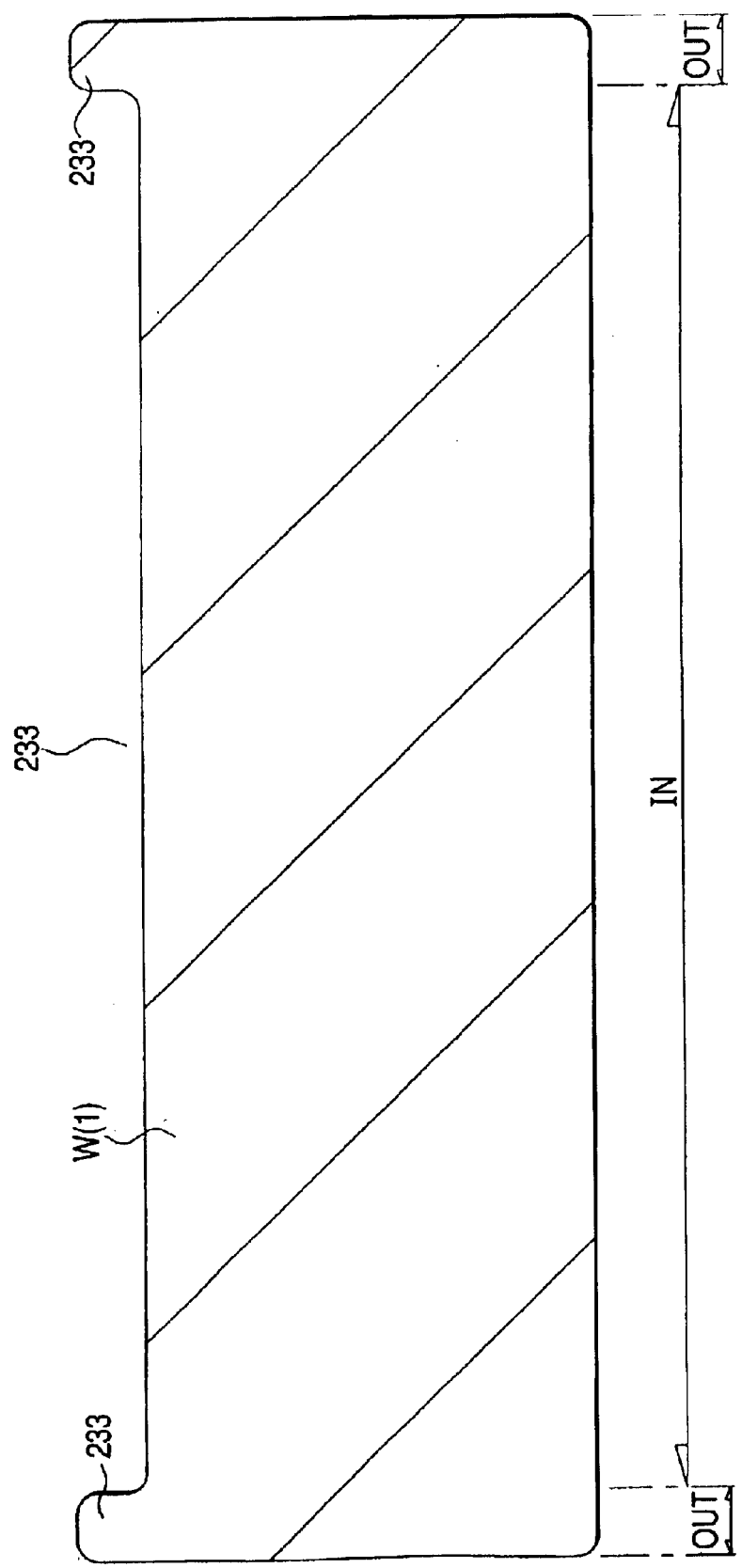
FIG. 34 is a fragmentary cross-sectional view of a wafer (substrate), which shows a method of manufacturing a semiconductor device, according to a fifth embodiment of the present invention.

Such a semiconductor wafer W as shown in FIG. 34 is prepared in which an internal area IN of the surface of the semiconductor wafer W is depressed or recessed (convex portion 231), and a protrusion (concave portion) 233 is provided at an outer peripheral portion OUT of the semiconductor wafer W. As a method of forming the recess (convex portion) 231, may be mentioned, for example, chemical etching, a so-called sand blaster method of spraying sand-like particles and polishing the back surface thereof, etc. in addition to grinder-based polishing, etc.

Figure 35:
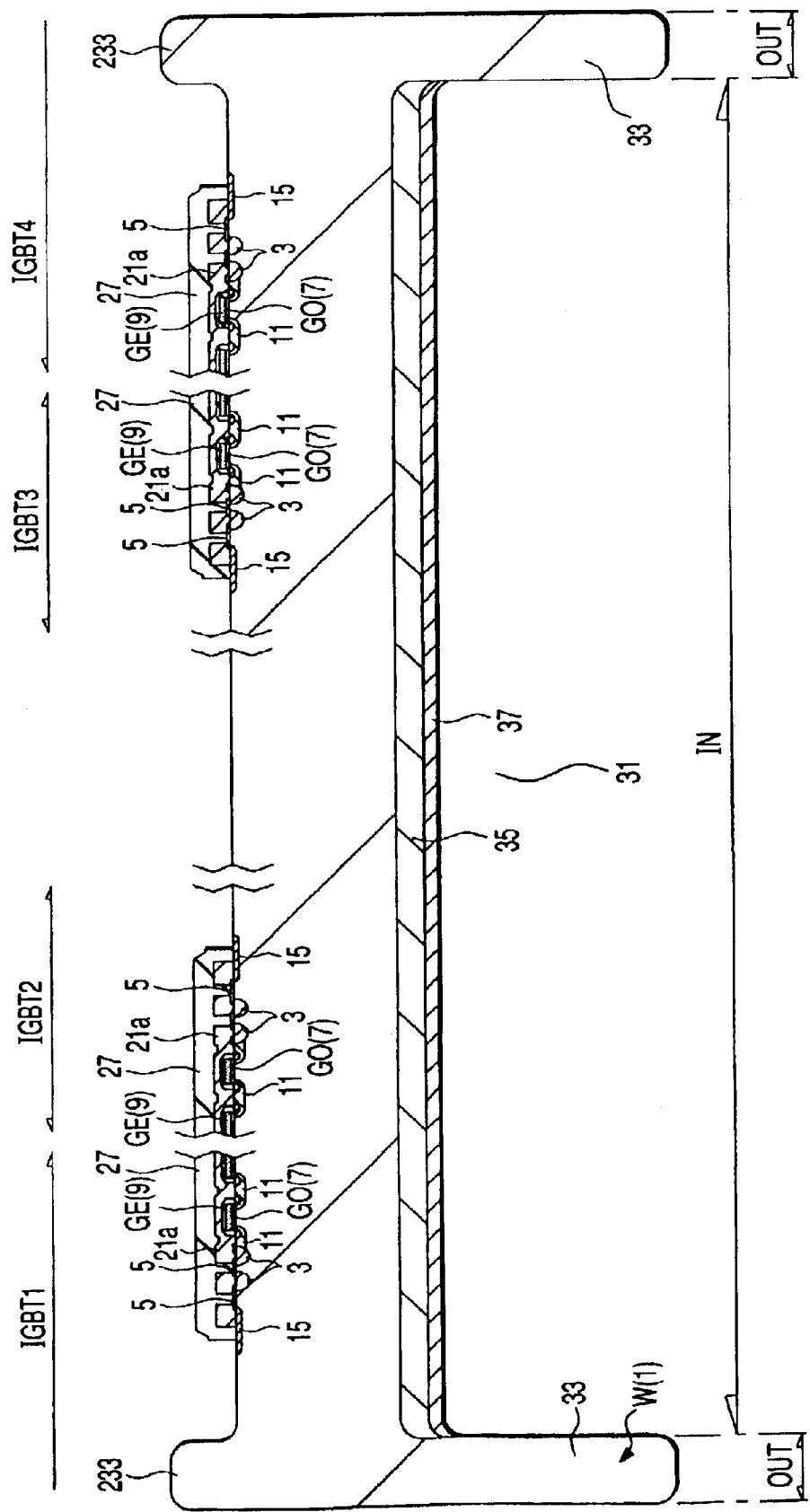
FIG. 35 is a fragmentary cross-sectional view of the wafer (substrate), which illustrates the method of manufacturing the semiconductor device, according to the fifth embodiment of the present invention.

Thereafter, elements such as IGBTs, MISFETs or the like are formed on a main surface of the internal area IN of the semiconductor wafer W. A fragmentary cross-sectional view of the semiconductor wafer formed with the IGBTs is shown in FIG. 35. Since the step for forming these has been described in detail in the first embodiment and the fourth embodiment or the like, the description thereof will be omitted.

Since the protrusion 233 is provided at the outer peripheral portion OUT of the surface of the semiconductor wafer W in the present embodiment, the destruction and contamination of the elements, wirings or the like on the surface of the semiconductor wafer W can be prevented where processing is effected on the back surface thereof. As the processing effected on the back surface of the semiconductor wafer W, may be mentioned, processes such as the formation of a collector region, the formation of a collector electrode, etc.

Figure 36:
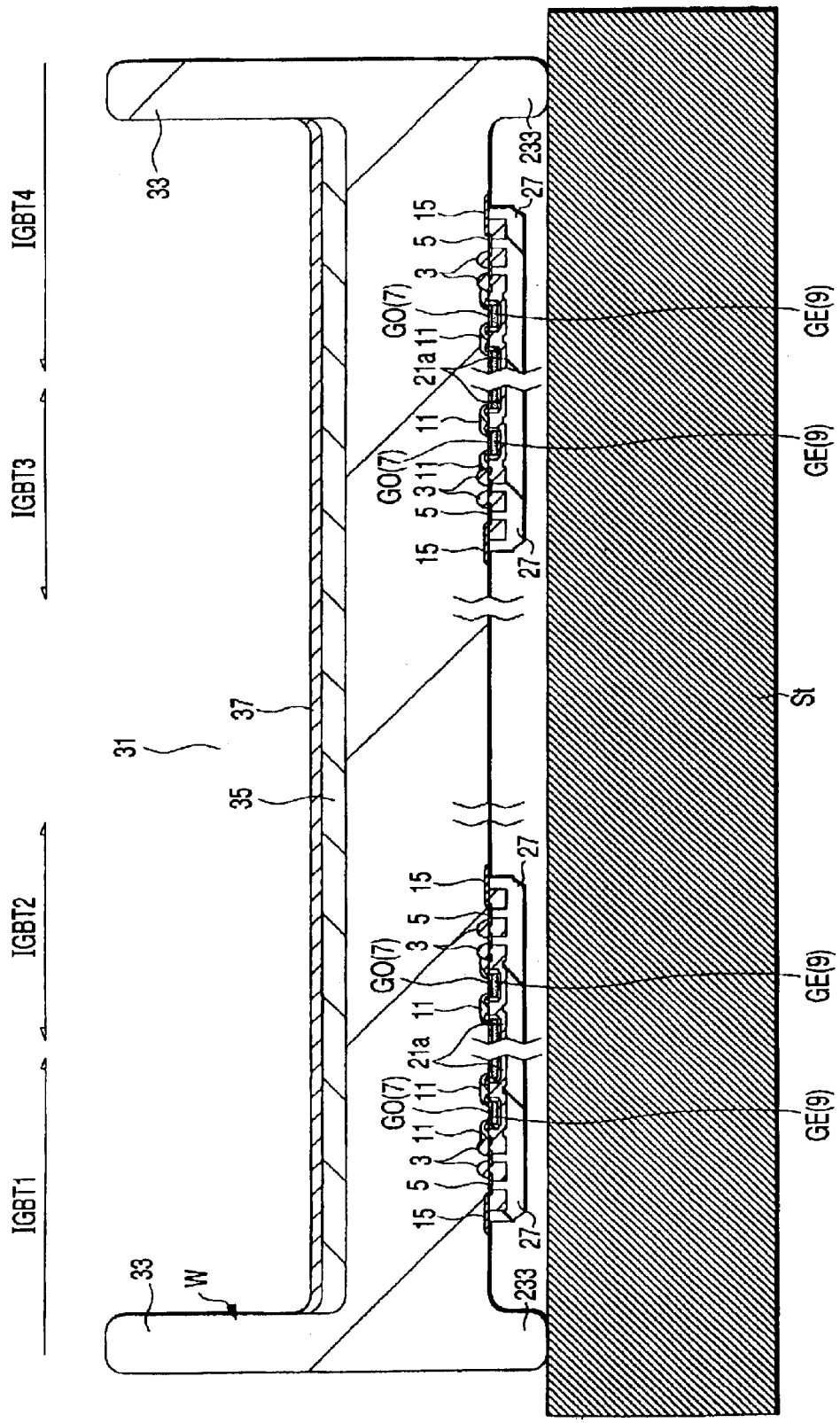
FIG. 36 is a fragmentary cross-sectional view of the wafer (substrate), which shows the method of manufacturing the semiconductor device, according to the fifth embodiment of the present invention.

As shown in FIG. 36 by way of example, the semiconductor wafer is mounted on a stage St having a diameter larger than the internal area IN of the semiconductor wafer, whereby the surface of the stage St and the surface (device or element forming surface) of the semiconductor wafer W can be prevented from directly contacting each other.

As a result, the elements, wirings, etc. on the surface of the semiconductor wafer W can be prevented from destruction and contamination. Thus, the height of the protrusion 233 at the outer peripheral portion OUT of the surface of the semiconductor wafer W may preferably be formed higher than that of, for example, a passivation film 27 corresponding to the top layer film of films deposited on the surface of the semiconductor wafer W in a wafer state.

Incidentally, it is not necessary that the area for polishing the back surface of the semiconductor wafer W and the area for surface polishing according to the present embodiment are identical in size.

(Sixth Embodiment)

Figure 37:
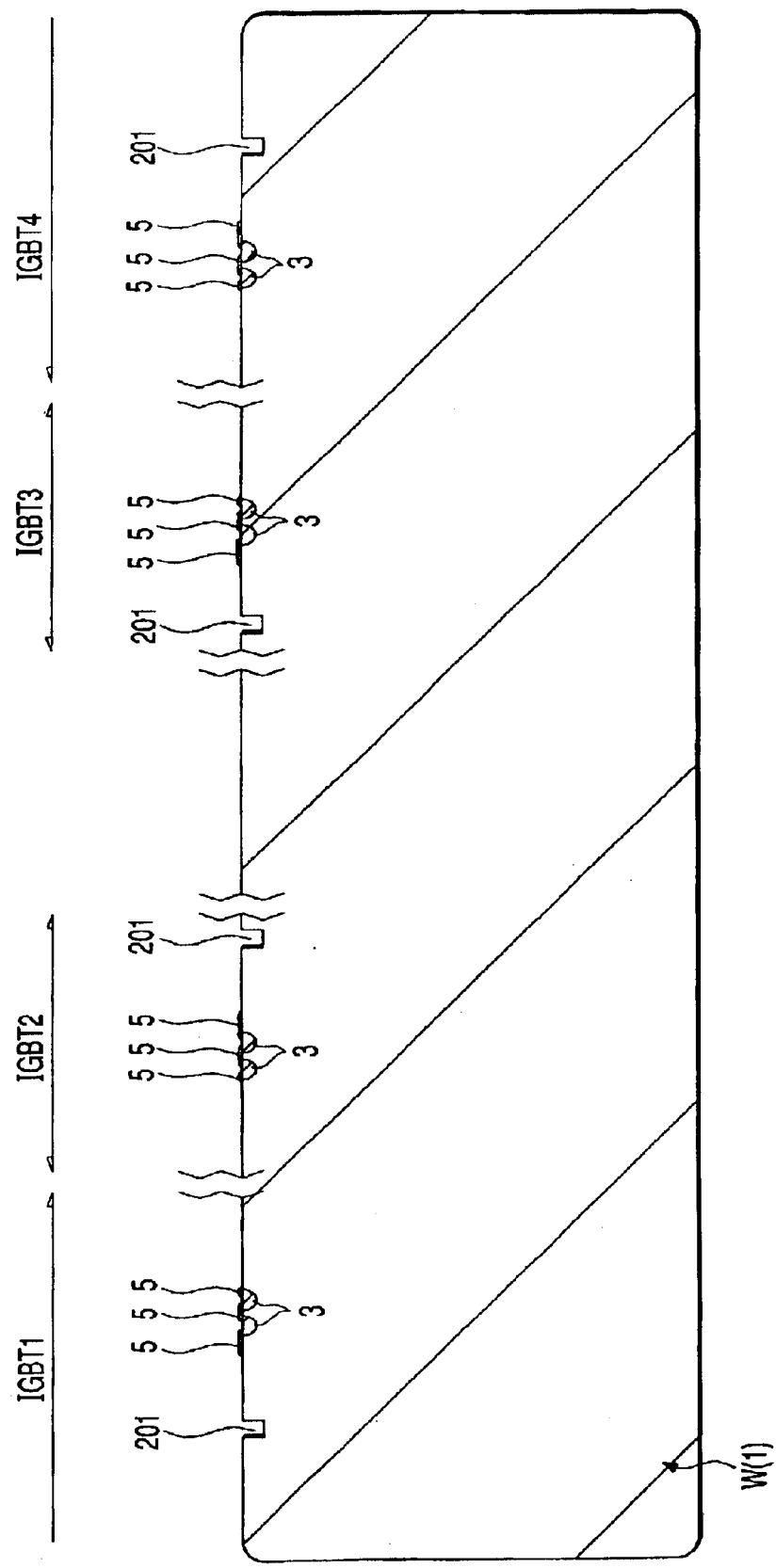
FIG. 37 is a fragmentary cross-sectional view of a wafer (substrate), which depicts a method of manufacturing a semiconductor device, according to a sixth embodiment of the present invention.

In the semiconductor device manufacturing method according to the present embodiment, trenches (concave portions) 201 may be defined in the corresponding scribe areas SA of the surface of the semiconductor wafer W in advance as shown in FIG. 37.

Since the semiconductor device manufacturing method according to the present embodiment is similar to the manufacturing methods according to the first through fifth embodiments except for the step of forming the trenches 201, the detailed description thereof will be omitted.

The trench forming step may be provided in the course of each of the semiconductor device manufacturing processes described in the first through fifth embodiments. However, the trenches may preferably be formed in the first or initial step where possible to relax stress applied to each film laminated on the surface of the semiconductor wafer. The depth of each trench may preferably be 5 $\mu$m or more.

The trenches 201 are defined in an upper portion of the semiconductor wafer W, for example, and can be formed by dry-etching the semiconductor wafer W with a mask film formed of a silicon nitride film or the like, having openings on scribe areas SA as a mask.

Thus, according to the present embodiment, since the trenches (stress relaxation trenches) 201 are defined in the scribed areas SA of the semiconductor wafer W, the stress can be relaxed by virtue of such trenches 201 even if a plurality of films are deposited on the surface and back surface of the semiconductor wafer W, so that warpage and cracking of the semiconductor wafer W can be prevented.

It is also possible to prevent warpage and cracking of the semiconductor wafer at dicing. Since the trenches 201 in each scribe area SA serve as weak portions even when stress equivalent to such an extent that the semiconductor wafer W breaks down, is applied upon dicing, it is possible to prevent the semiconductor wafer W from cracking along the scribe areas SA and avoid cracks in chip areas.

(Seventh Embodiment)

While the surface and back surface of the semiconductor wafer W are depressed to provide the protrusion at the outer peripheral portion OUT in the first embodiment or the like, a ring-shaped member may be applied onto the outer peripheral portion OUT of the semiconductor wafer W to form the protrusion 33.

A method of manufacturing a semiconductor device, according to the present embodiment will be described below.

Figure 38:
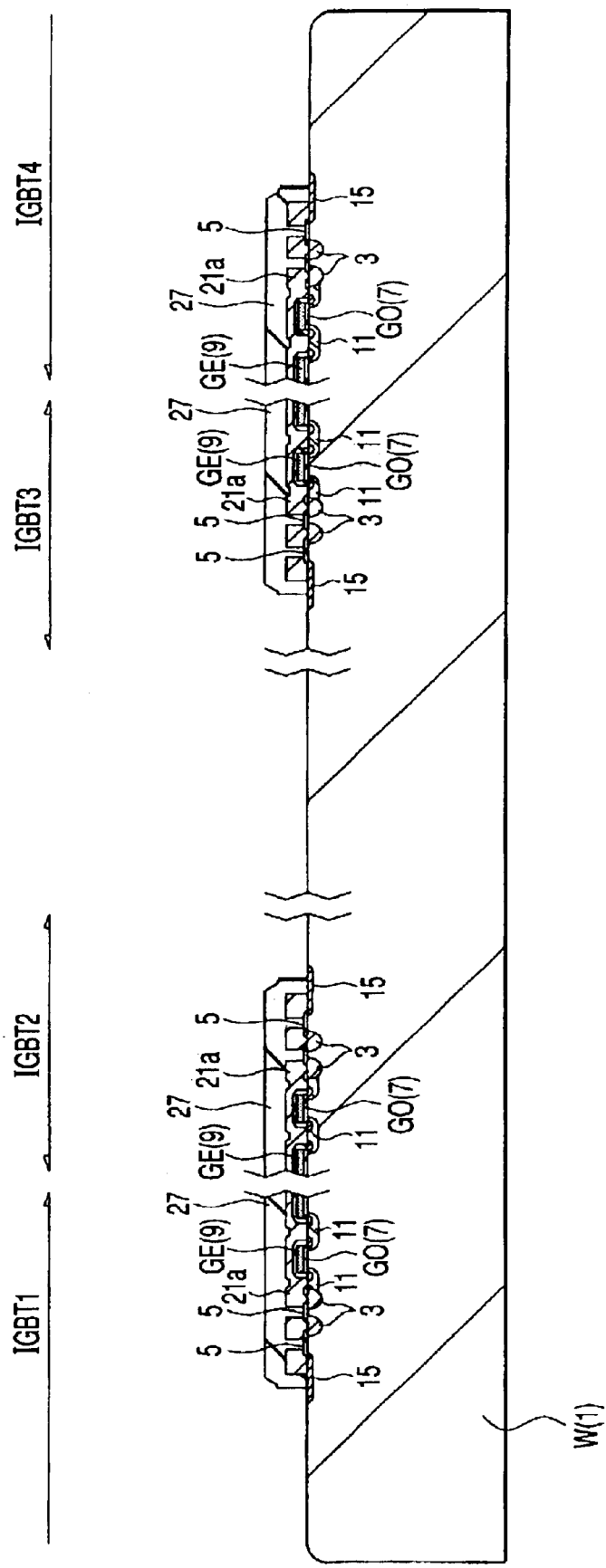
FIG. 38 is a fragmentary cross-sectional view of a wafer (substrate), which shows a method of manufacturing a semiconductor device, according to a seventh embodiment of the present invention.
Figure 39:
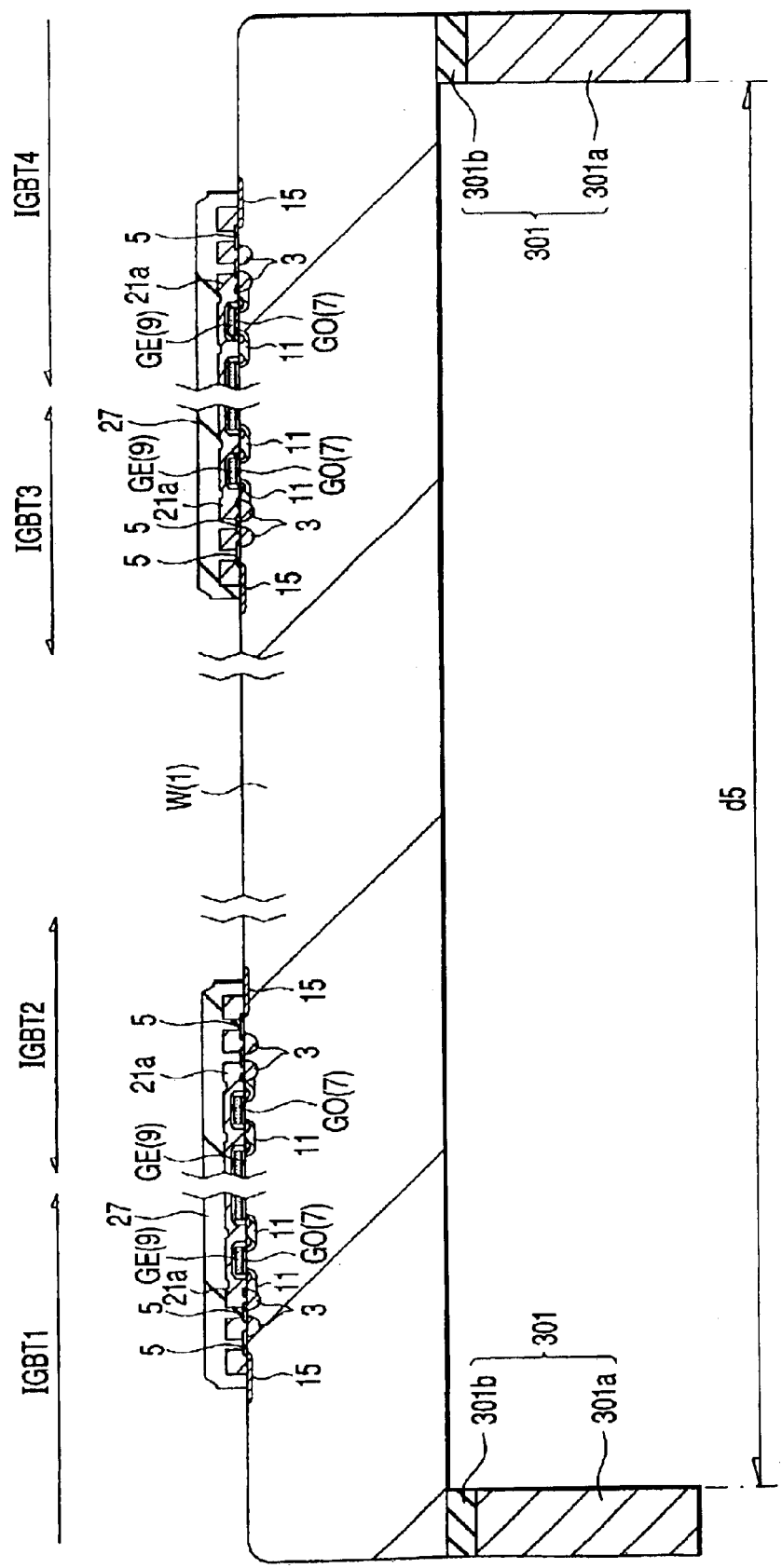
FIG. 39 is a fragmentary cross-sectional view of the wafer (substrate), which illustrates the method of manufacturing the semiconductor device, according to the seventh embodiment of the present invention.

In the first embodiment, for example, the back surface of the semiconductor wafer W is polished so that the protrusion 33 is formed at the outer peripheral portion OUT in the step described with reference to FIG. 10. However, as shown in FIG. 38 at this time, the entirety of the back surface of the semiconductor wafer W is polished and the thickness thereof is made small, followed by application of a ring-shaped member 301 onto the back surface thereof (see FIG. 39).

The ring-shaped member 301 is formed of a laminated film of a polycrystal silicon film 301a and a silicon oxide film 301b formed thereover, for example. The laminated film thereof is adhered to the back surface of the post-polishing semiconductor wafer W. Thereafter, they are subjected to, for example, heat treatment to thereby enable their bonding.

The inside diameter of the ring-shaped member 301 is d5. The inside diameter d5 is larger than the diameter d2 (see FIG. 1) of the minimum circle that surrounds the chip areas CA. Further, its outside diameter is nearly equal to the outside diameter of the semiconductor wafer.

Incidentally, the material for the ring-shaped member is not limited to one referred to above. If ones capable of maintaining the strength of the semiconductor wafer W are adopted, then other materials may be used.

After the bonding of the ring-shaped member 301, the semiconductor device can be formed through steps similar to the respective embodiments.

The present ring-shaped member may be bonded to the back surface as an alternative to the protrusion 33 described with reference to FIG. 34 in the fifth embodiment.

Thus, according to the present embodiment, since the thickness of the semiconductor wafer W is ensured before the polishing of the back surface of the semiconductor wafer W, cracking and distortion of the semiconductor wafer W can be prevented, and the characteristic of each semiconductor element formed on its main surface can be enhanced. A semiconductor wafer W having a large bore diameter can be used, and yields can be enhanced. Further, a TAT can be shortened.

Further, since the ring-shaped member 301 is bonded to the outer peripheral portion OUT of the semiconductor wafer W after the polishing of the back surface of the semiconductor wafer W, the strength of the semiconductor wafer W can be maintained even in subsequent steps. If the semiconductor wafer W is supported by the stage St whose diameter is smaller than the inside diameter d5 of the ring-shaped member 301, and subjected to dicing, then the present embodiment can bring about an effect such as the ability to prevent cracking of the semiconductor wafer W in such a step, which is similar to the first embodiment or the like.

While the invention developed above by the present inventors has been described specifically based on the illustrated embodiments, the present invention is not limited to the illustrated embodiments. It is needless to say that various changes can be made thereto within the scope not departing from the substance thereof.

Advantageous effects of typical or representative ones of the inventions disclosed by the present application will be described in brief as follows:

(1) An internal area of a back surface of a semiconductor wafer is polished to form a protrusion at an outer peripheral portion of the back surface of the semiconductor wafer. Thereafter, the semiconductor wafer is mounted on a support table whose surface is smaller than the internal area of the semiconductor wafer, and the internal area of the back surface of the semiconductor wafer is supported by the support table. Then scribe areas on the surface of the semiconductor wafer are cut. Therefore, the strength of the semiconductor wafer can be maintained even after thinning of the semiconductor wafer. Further, warpage and cracking of the semiconductor wafer can be reduced. It is possible to make it easy to perform processing subsequent to the thinning of the semiconductor wafer. The characteristic of a semiconductor device can be improved, and its yields and TAT can be enhanced.

(2) Since a semiconductor wafer having a plurality of chip areas comparted by scribe areas is configured such that an internal area of a back surface of the semiconductor wafer is recessed as compared with its outer peripheral portion, and trenches are defined on the scribe areas, the strength thereof can be maintained, and warpage and cracking of the semiconductor wafer can be reduced.

What is claimed is:

1. A method of manufacturing a semiconductor device, comprising the steps of:
   (a) preparing a semiconductor wafer having a plurality of chip areas respectively comparted by scribe areas;
   (b) polishing an internal area of a back surface of the semiconductor wafer to thereby form a protrusion at an outer peripheral portion of the back surface of the semiconductor wafer;
   (c) mounting the semiconductor wafer on a support table whose surface is smaller than the internal area of the semiconductor wafer and supporting the internal area of the back surface of the semiconductor wafer by the support table; and
   (d) cutting the scribe areas on the surface of the semiconductor wafer after the (c) step.

2. The method according to claim 1, wherein a diameter of the surface of the support table is larger than a diameter of a minimum circle that surrounds the plurality of chip areas, and is smaller than a of the internal area.

3. The method according to claim 1, further comprising the steps of:
   (e) applying a tape to the back surface including the internal area of the semiconductor wafer between the (d) step and the (c) step;
   (f) removing the protrusion of the back surface of the semiconductor wafer after the (e) step; and
   (g) pulling the tape to thereby separate the plurality of chip areas from one another.

4. The method according to claim 1, further comprising the steps of:
   (e) applying a tape to the back surface including the internal area of the semiconductor wafer between the (d) step and the (c) step;
   (f) removing the protrusion of the back surface of the semiconductor wafer after the (e) step;

(g) pulling the tape to thereby separate the plurality of chip areas from one another; and (h) peeling off the plurality of chip areas from the tape.

5. A method of manufacturing a semiconductor device, comprising the steps of:

(a) preparing a semiconductor wafer having a plurality of chip areas respectively comparted by scribe areas;

(b) forming semiconductor elements and wirings over the chip areas;

(c) forming, over the semiconductor elements and wrings, a protective film corresponding to an insulating film of a top layer for covering these;

(d) polishing an internal area of a back surface of the semiconductor wafer to thereby form a protrusion at an outer peripheral portion of the back surface of the semiconductor wafer;

(e) mounting the semiconductor wafer on a support table whose surface is smaller than the internal area of the semiconductor wafer and supporting the internal area of the back surface of the semiconductor wafer by the support table; and (f) processing the semiconductor wafer after the (e) step.

6. The method according to claim 5, wherein the (d) step is subsequent to the (c) step.

7. The method according to claim 6, wherein the (f) step is a step of cutting the scribe areas of the semiconductor wafer.

8. The method according to claim 5, wherein the (d) step follows on the formation of the wirings in the (b) step or the formation of an insulating film over the wirings.

9. The method according to claim 5, wherein the (d) step follows on the formation of a conductive film constituting the semiconductor elements in the (c) step.

10. The method according to claim 5, wherein the (f) step is a step of forming a film constituting the semiconductor elements or wirings in the (b) step or the protective film in the (c) step.

11. The method according to claim 5, wherein the semiconductor elements are MISFETs or bipolar transistors.

12. The method according to claim 5, further comprising a step of:

(g) between the (d) step and the (e) step, injecting an impurity into the back surface of the semiconductor wafer or forming a film on the back surface of the semiconductor wafer.

13. The method according to claim 5, further comprising the steps of:

(g) between the (d) step and the (e) step, forming a conductive film on the back surface of the semiconductor wafer, wherein a conductive film constituting the wirings in the (c) step is formed over the surface of the semiconductor wafer simultaneously with the formation of the conductive film in the (g) step.

14. The method according to claim 5, wherein a step for polishing an area including the plurality of chip areas of the semiconductor wafer from the surface of the semiconductor wafer and polishing an area lying outside the plurality of chip areas so as to become higher than at least the protective film in height is provided before the (b) step.

15. The method according to claim 5, further comprising a step of:

(g) forming trenches in the scribe areas of the semiconductor wafer prior to at least the (d) step.

16. A method of manufacturing a semiconductor device, comprising the steps of:

(a) preparing a semiconductor wafer having a plurality of chip areas respectively comparted by scribe areas;

(b) forming MISFETs over the chip areas, said (b) step including steps of:

(b1) forming an insulating film over the semiconductor wafer;

(b2) forming a conductive film over the insulating film;

(b3) selectively removing the conductive film to thereby form gate electrodes; and (b4) forming semiconductor regions in the semiconductor wafer on both sides of each of the gate electrodes;

(c) polishing the back surface of the semiconductor wafer, corresponding to an internal area of the semiconductor wafer after at least the (b2) step to thereby form a protrusion at an outer peripheral portion of the back surface of the semiconductor wafer;

(d) mounting the semiconductor wafer on a support table whose surface is smaller than the internal area of the semiconductor wafer and supporting the internal area of the back surface of the semiconductor wafer by the support table; and (e) cutting the scribe areas of the semiconductor wafer after the (c) step.

17. A method of manufacturing a semiconductor device, comprising the steps of:

(a) preparing a semiconductor wafer having a plurality of chip areas respectively comparted by scribe areas;

(b) over the chip area, including the steps of:

(b1) forming a first insulating film;

(b2) forming a first conductive film over the first insulating film;

(b3) selectively removing the first conductive film to thereby form gate electrodes;

(b4) forming a first semiconductor region of first conductivity type in the semiconductor wafer on both sides of each of the gate electrodes;

(b5) forming a second semiconductor region of second conductivity type opposite to the first conductivity type in the first semiconductor region;

(b6) forming a second insulating film having openings over the second semiconductor region over the semiconductor wafer;

(b7) forming a second conductive film over the second semiconductor region including the interiors of the openings;

(b8) selectively removing the second conductive film to thereby form wirings; and (b9) forming a protective film corresponding to an insulating film of a top layer for covering the wirings, over the wirings, (c) after the (b2) step, the (b7) step or the (b9) step, polishing an internal area of a back surface of the semiconductor wafer to thereby form a protrusion at an outer peripheral portion of the back surface of the semiconductor wafer;

(d) performing processing on the back surface of the semiconductor wafer after the (c) step, said step including the steps of:

(d1) forming a third semiconductor region of the first conductivity type on the back surface of the semiconductor wafer; and (d2) forming a third conductive film on the back surface of the semiconductor wafer, (e) mounting the semiconductor wafer on a support table whose surface is smaller than the internal area of the semiconductor wafer and supporting the internal area of the back surface of the semiconductor wafer by the support table; and (f) cutting the scribe areas of the semiconductor wafer after the (e) step.

18. The method according to claim 17, wherein the (c) step is performed before at least the (b7) step, and the second conductive film in the (b7) step and the third conductive film in the (d2) step are simultaneously formed.

19. A method of manufacturing a semiconductor device, comprising the steps of:
(a) preparing a semiconductor wafer having a plurality of chip areas respectively comparted by scribe areas;
(b) bonding a ring-shaped member whose inside diameter is larger than a diameter of a minimum circle surrounding the plurality of chip areas, to an outer peripheral portion of a back surface of the semiconductor wafer;
(c) mounting the semiconductor wafer on a support table whose surface is smaller than the inside diameter of the ring-shaped member and supporting the back surface of the semiconductor wafer by the support table; and
(d) cutting the scribe areas of the semiconductor wafer after the (c) step.

* * * * *